(12) United States Patent
Chen et al.

(10) Patent No.: US 10,326,003 B2
(45) Date of Patent: Jun. 18, 2019

(54) FINFET DEVICE AND METHODS OF FORMING

(71) Applicant: Taiwan Semiconductor Manufacturing Company, Ltd., Hsinchu (TW)

(72) Inventors: Chia-Cheng Chen, Hsinchu (TW); Huicheng Chang, Tainan (TW); Liang-Yin Chen, Hsinchu (TW); Chun-Feng Nieh, Hsinchu (TW); Li-Ting Wang, Hsinchu (TW); Wan-Yi Kao, Baoshan Township (TW); Chia-Ling Chan, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 13 days.

(21) Appl. No.: 15/473,089

(22) Filed: Mar. 29, 2017

(65) Prior Publication Data

US 2018/0151701 A1    May 31, 2018

Related U.S. Application Data

(60) Provisional application No. 62/427,023, filed on Nov. 28, 2016.

(51) Int. Cl.
| | |
|---|---|
| *H01L 29/66* | (2006.01) |
| *H01L 21/02* | (2006.01) |
| *H01L 21/3105* | (2006.01) |
| *H01L 21/3115* | (2006.01) |
| *H01L 21/8234* | (2006.01) |
| *H01L 27/088* | (2006.01) |

(Continued)

(52) U.S. Cl.
CPC .... *H01L 29/66795* (2013.01); *H01L 21/0206* (2013.01); *H01L 21/02068* (2013.01); *H01L 21/3115* (2013.01); *H01L 21/31051* (2013.01); *H01L 21/823418* (2013.01); *H01L 21/823431* (2013.01); *H01L 21/823437* (2013.01); *H01L 27/0886* (2013.01); *H01L 29/0847* (2013.01); *H01L 29/165* (2013.01); *H01L 29/6656* (2013.01); *H01L 29/6659* (2013.01); *H01L 29/66545* (2013.01); *H01L 29/66636* (2013.01); *H01L 29/7833* (2013.01); *H01L 29/7834* (2013.01); *H01L 29/7851* (2013.01); *H01L 21/823814* (2013.01)

(58) Field of Classification Search
CPC .......................... H01L 21/0206; H01L 21/3115
See application file for complete search history.

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |

(Continued)

*Primary Examiner* — Joseph C. Nicely
*Assistant Examiner* — Lamont B Koo
(74) *Attorney, Agent, or Firm* — Slater Matsil, LLP

(57) ABSTRACT

A finFET device and methods of forming a finFET device are provided. The method includes forming a first gate spacer is formed over a dummy gate of a fin field effect transistor (finFET). The method also includes performing a carbon plasma doping of the first gate spacer. The method also includes forming a plurality of source/drain regions, where a source/drain region is disposed on opposite sides of the dummy gate. The method also includes removing dummy gate.

20 Claims, 58 Drawing Sheets

(51) Int. Cl.
  *H01L 29/08* (2006.01)
  *H01L 29/78* (2006.01)
  *H01L 29/165* (2006.01)
  H01L 21/8238 (2006.01)

(56) References Cited

U.S. PATENT DOCUMENTS

| | | |
|---|---|---|
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 2012/0202326 A1* | 8/2012 | Kronholz .......... H01L 21/31111 438/231 |
| 2014/0015104 A1* | 1/2014 | Su .................. H01L 21/225 257/611 |
| 2015/0123147 A1* | 5/2015 | He .................. H01L 29/7848 257/77 |
| 2016/0005596 A1* | 1/2016 | Behera ............. H01L 21/02115 438/703 |
| 2016/0372567 A1* | 12/2016 | Tak .................. H01L 29/6656 |
| 2016/0380083 A1* | 12/2016 | Basker ............. H01L 29/0673 257/347 |
| 2017/0154826 A1* | 6/2017 | Posseme .......... H01L 21/82386 |

\* cited by examiner

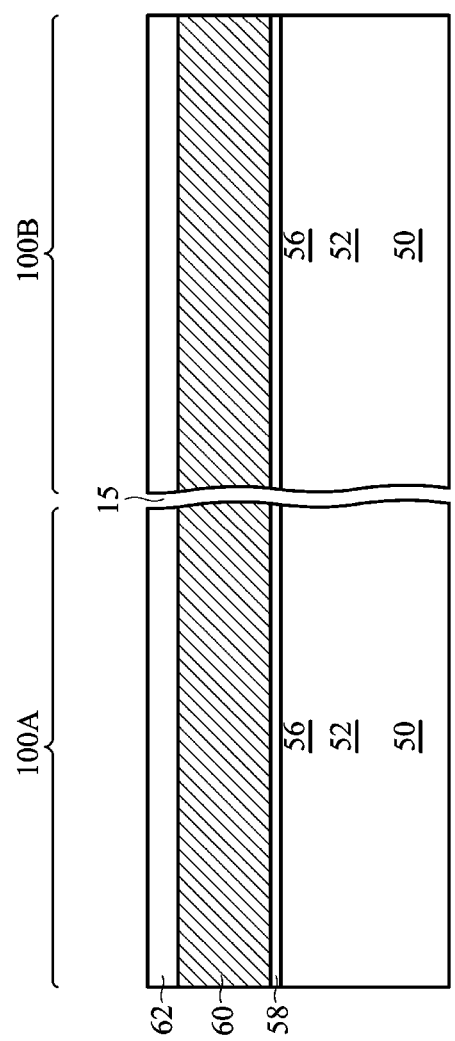

FINFET DEVICE AND METHODS OF FORMING

PRIORITY CLAIM AND CROSS-REFERENCE

This application claims priority to U.S. Provisional Application No. 62/427,023, filed on Nov. 28, 2016, which is hereby incorporated by reference in its entirety.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6A and 6B are cross-sectional views of intermediate stages in the manufacture of a finFET device in accordance with some embodiments.

DETAILED DESCRIPTION

Figure 1:
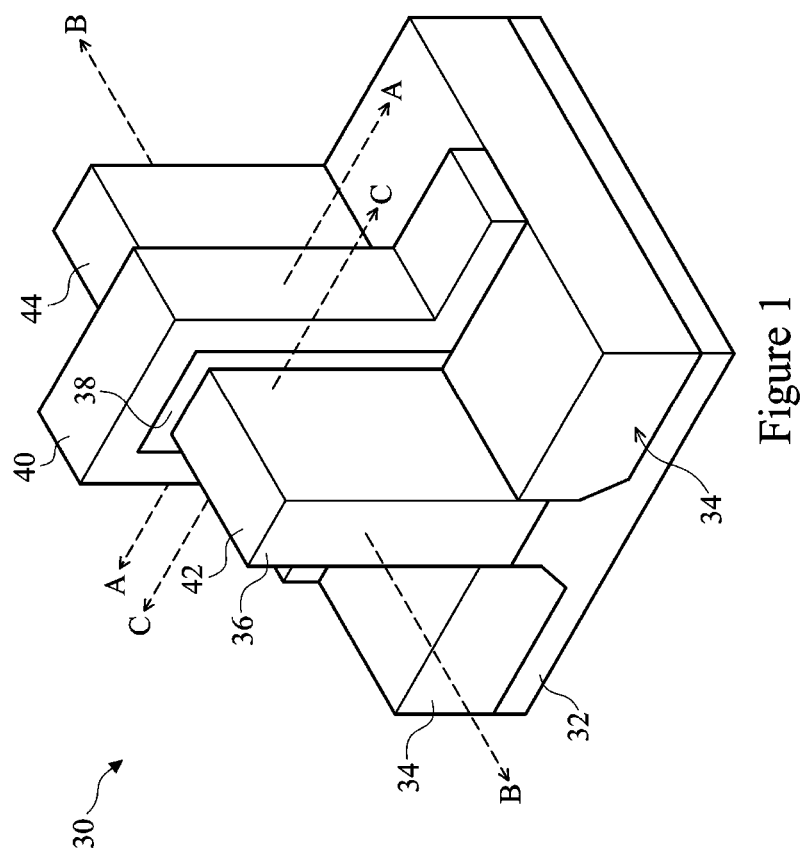
FIG. 1 is a perspective view of a fin field effect transistor ("finFET") device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates an example of a fin field-effect transistor (finFET) 30 in a three-dimensional view. The finFET 30 comprises a fin 36 on a substrate 32. The substrate 32 includes isolation regions 34, and the fin 36 protrudes above and from between neighboring isolation regions 34. A gate dielectric 38 is along sidewalls and over a top surface of the fin 36, and a gate electrode 40 is over the gate dielectric 38. Source/drain regions 42 and 44 are disposed in opposite sides of the fin 36 with respect to the gate dielectric 38 and gate electrode 40. FIG. 1 further illustrates reference cross-sections that are used in later figures. Cross-section A-A is across a channel, gate dielectric 38, and gate electrode 40 of the finFET 30. Cross-section C-C is in a plane that is parallel to cross section A-A and is across fin 36 outside of the channel. Cross-section B-B is perpendicular to cross-section A-A and is along a longitudinal axis of the fin 36 and in a direction of, for example, a current flow between the source/drain regions 42 and 44. Subsequent figures refer to these reference cross-sections for clarity.

Some embodiments discussed herein are discussed in the context of finFETs formed using a gate-last process. In other embodiments, a gate-first process may be used. Also, some embodiments contemplate aspects used in planar devices, such as planar FETs.

Figure 24A:
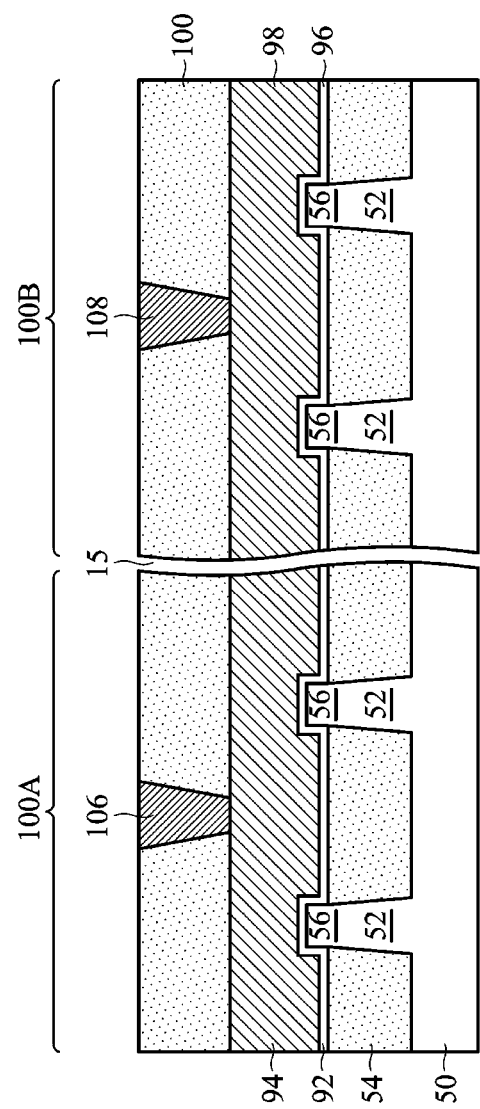
FIGS. 24A and 24B are cross-sectional views of intermediate stages in the manufacture of a finFET device in accordance with some embodiments.
Figure 24B:
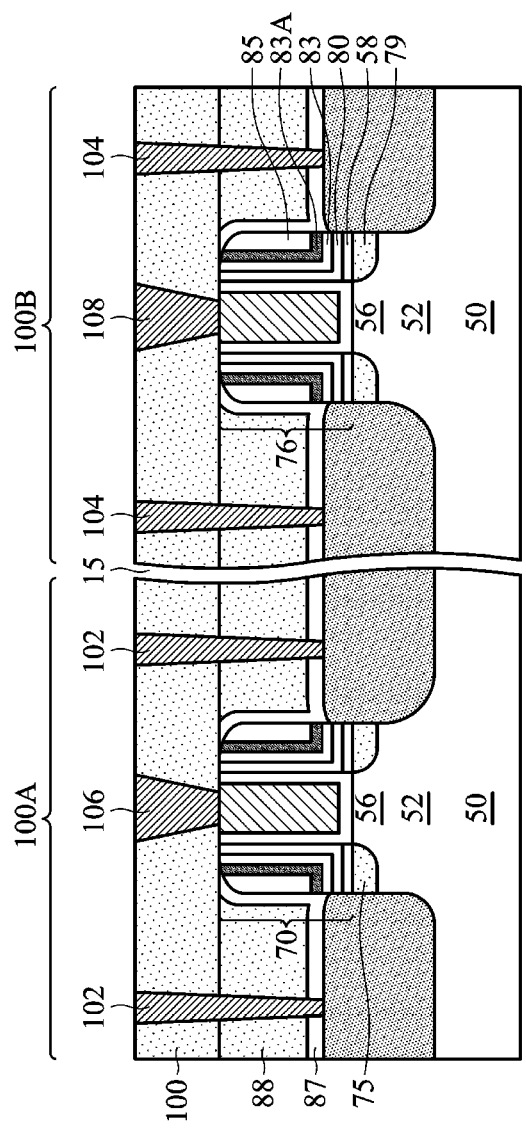
Figure 25:
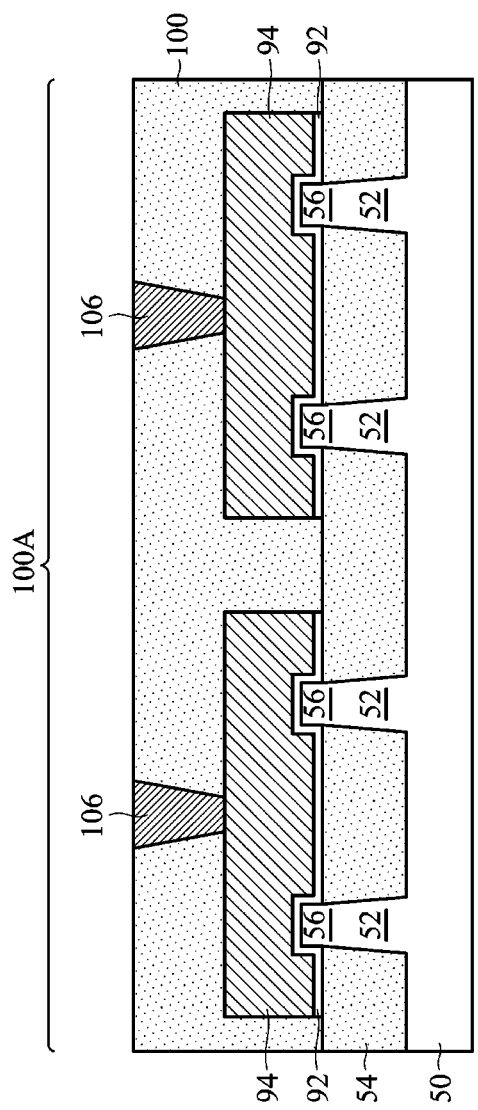
FIGS. 25 and 26 are cross-sectional views of intermediate stages in the manufacture of a finFET device in accordance with some embodiments.
Figure 26:
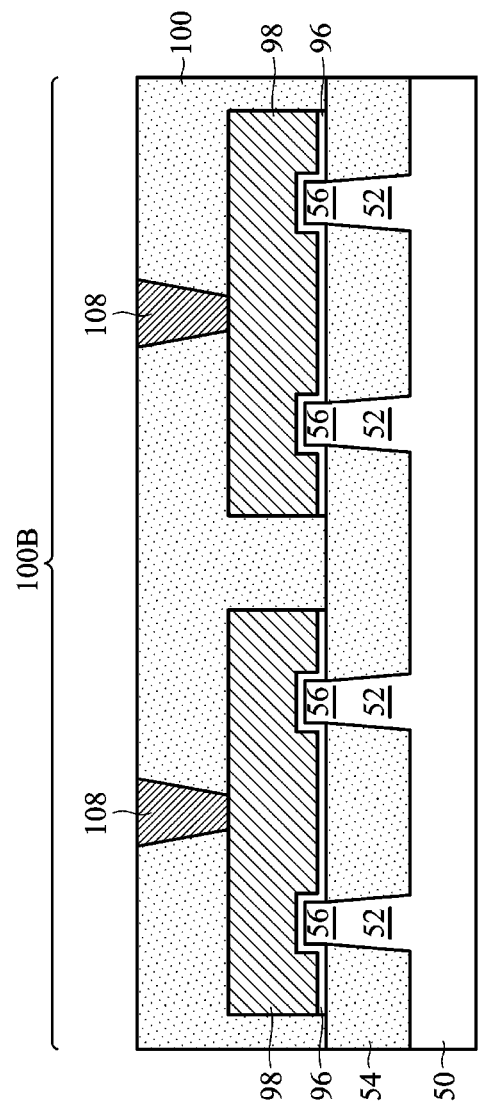

FIGS. 2 through 26 are cross-sectional views of intermediate stages in the manufacturing of finFETs in accordance with an exemplary embodiment. FIGS. 2 through 5 illustrate reference cross-section A-A illustrated in FIG. 1, except for multiple finFETs. In FIGS. 6 through 24B, figures ending with an "A" designation are illustrated along a similar cross-section A-A; figures ending with a "B" designation are illustrated along a similar cross-section B-B; and figures ending with a "C" designation are illustrated along a similar cross-section C-C. FIGS. 15 and 18 illustrate reference cross-section C-C illustrated in FIG. 1. FIGS. 25 and 26 illustrate reference cross-section A-A illustrated in FIG. 1.

Figure 2:
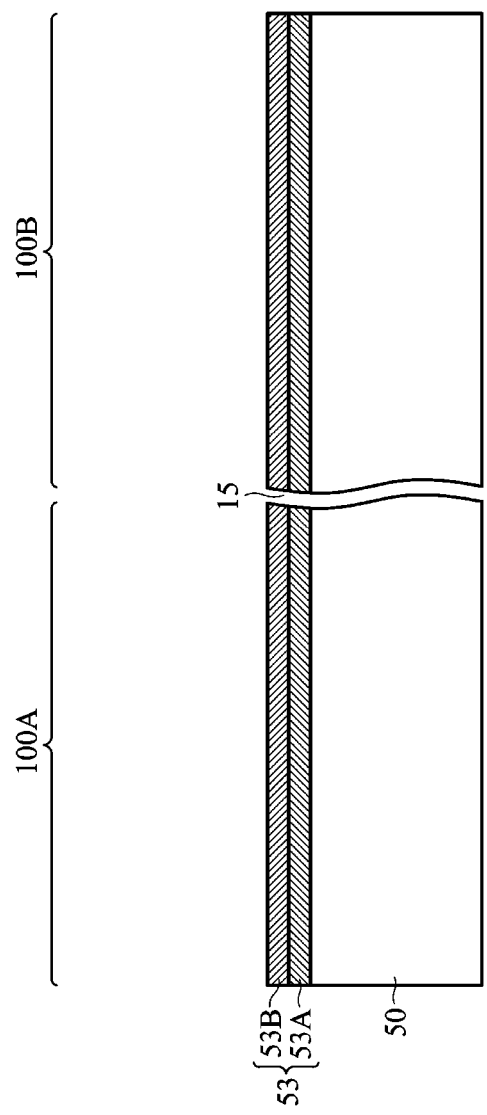
FIGS. 2-5 are cross-sectional views of intermediate stages in the manufacture of a finFET device in accordance with some embodiments.

FIG. 2 illustrates a substrate 50. Substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 has a first region 100A and a second region 100B. The first region 100A can be for forming n-type devices, such as NMOS transistors, such as n-type finFETs. The second region 100B can be for forming p-type devices, such as PMOS transistors, such as p-type finFETs. The divider 15 between the first region 100A and the second region 100B indicates a physical separation between the first region 100A and the second region 100B. Components of first region 100A may be physically separated from components of second region 100B, but are illustrated side by side in FIGS. 2 through 24B for purposes of illustration.

FIG. 2 also shows the forming of mask 53 over substrate 50. In some embodiments, mask 53 may be used in a subsequent etching step to pattern substrate 50 (See FIG. 3). As shown in FIG. 2, mask 53 may include first mask layer 53A and second mask layer 53B. Mask layer 53A may be a hard mask layer, such as silicon nitride or the like, and may be formed using any suitable process, such as a deposition, atomic layer deposition (ALD) or physical vapor deposition (PVD). Mask layer 53A may be used to prevent or minimize an etching of substrate 50 underlying mask layer 53A in the subsequent etch step (See FIG. 3). Mask layer 53B may comprise photoresist, and in some embodiments may be used to pattern mask layer 53A for use in the subsequent etching step discussed above. Mask layer 53B can be formed by using a spin-on technique and can be patterned using acceptable photolithography techniques. In some embodiments, three or more masks 53 may be used.

Figure 3:
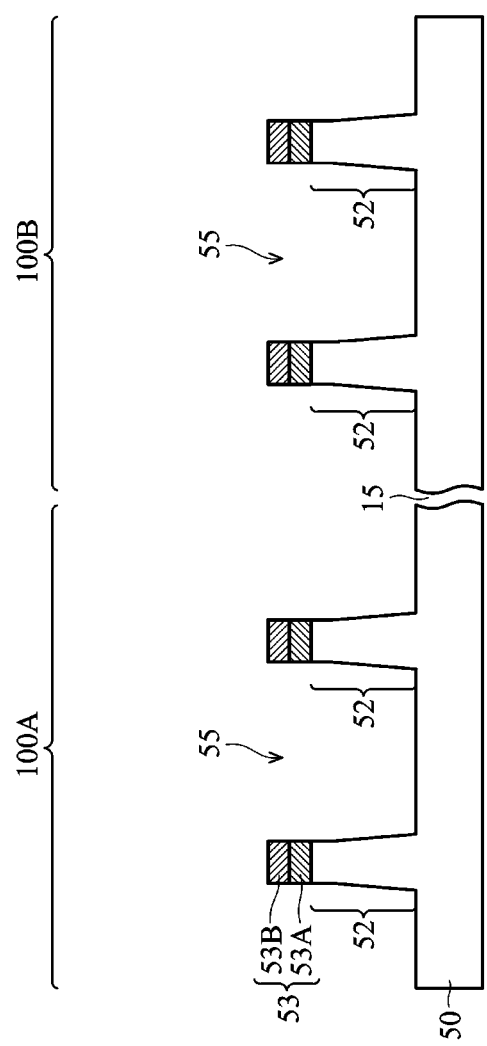

FIG. 3 illustrates the formation of semiconductor strips 52 in the substrate 50. First, mask layers 53A and 53B may be patterned, where openings in mask layers 53A and 53B expose areas of substrate 50 where trenches will be formed. Next, an etching process may be performed, where the etching process creates trenches in substrate 50 through openings in mask 53. The remaining sections of substrate 50 underlying patterned mask 53 form a plurality of semiconductor strips 52. The etching may be any acceptable etch process, such as a reactive ion etch (RIE), neutral beam etch (NBE), the like, or a combination thereof. The etch may be anisotropic.

Figure 4:
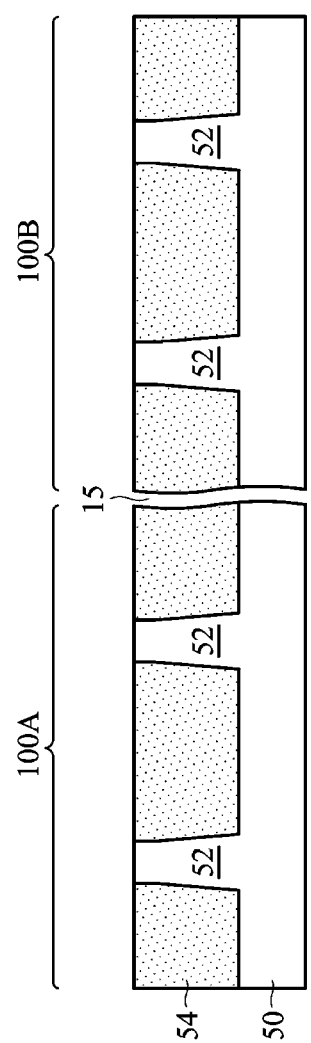

In FIG. 4 an insulation material is formed between neighboring semiconductor strips 52 to form isolation regions 54. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used.

Furthermore, in some embodiments, isolation regions 54 may include a conformal liner (not illustrated) formed on sidewalls and a bottom surface of trenches 55 (see FIG. 3) prior to the filling of trenches 55 with an insulation material of isolation regions 54. In some embodiments, the liner may comprise a semiconductor (e.g., silicon) nitride, a semiconductor (e.g., silicon) oxide, a thermal semiconductor (e.g., silicon) oxide, a semiconductor (e.g., silicon) oxynitride, a polymer dielectric, combinations thereof, and the like. The formation of the liner may include any suitable method, such as, ALD, CVD, high density plasma (HDP) CVD, PVD, and the like. In such embodiments, the liner may prevent (or at least reduce) the diffusion of semiconductor material from semiconductor strips 52 (e.g., Si and/or Ge) into the surrounding isolation regions 54 during the annealing of isolation regions 54.

An anneal process may be performed once the insulation material is formed. In the illustrated embodiment, the insulation material is silicon oxide formed by a FCVD process. The insulating material may be referred to as isolation regions 54. Further in FIG. 4, a planarization process, such as a chemical mechanical polish (CMP), may remove any excess insulation material and form top surfaces of the isolation regions 54 and top surfaces of the semiconductor strips 52 that are coplanar. In some embodiments, the CMP may also remove mask 53. In other embodiments mask 53 may be removed using a wet cleaning process.

Figure 5:
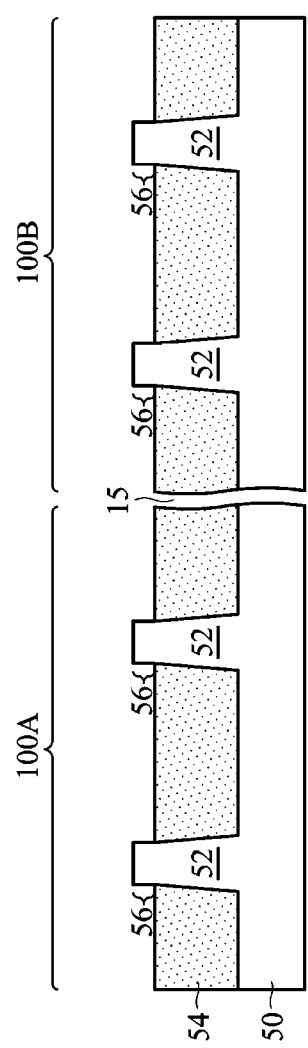

FIG. 5 illustrates the recessing of the isolation regions 54 to form Shallow Trench Isolation (STI) regions 54. The isolation regions 54 are recessed such that fins 56 in the first region 100A and in the second region 100B protrude from between neighboring isolation regions 54. Further, the top surfaces of the isolation regions 54 may have a flat surface as illustrated, a convex surface, a concave surface (such as dishing), or a combination thereof. The top surfaces of the isolation regions 54 may be formed flat, convex, and/or concave by an appropriate etch. The isolation regions 54 may be recessed using an acceptable etching process, such as one that is selective to the material of the isolation regions 54. For example, a chemical oxide removal using a CERTAS® etch or an Applied Materials SICONI tool or dilute hydrofluoric (dHF) acid may be used.

A person having ordinary skill in the art will readily understand that the process described with respect to FIGS. 2 through 5 is just one example of how fins 56 may be formed. In other embodiments, a dielectric layer can be formed over a top surface of the substrate 50; trenches can be etched through the dielectric layer; homoepitaxial structures can be epitaxially grown in the trenches; and the dielectric layer can be recessed such that the homoepitaxial structures protrude from the dielectric layer to form fins. In still other embodiments, heteroepitaxial structures can be used for the fins. For example, the semiconductor strips 52 in FIG. 4 can be recessed, and a material different from the semiconductor strips 52 may be epitaxially grown in their place. In an even further embodiment, a dielectric layer can be formed over a top surface of the substrate 50; trenches can be etched through the dielectric layer; heteroepitaxial structures can be epitaxially grown in the trenches using a material different from the substrate 50; and the dielectric layer can be recessed such that the heteroepitaxial structures protrude from the dielectric layer to form fins 56. In some embodiments where homoepitaxial or heteroepitaxial structures are epitaxially grown, the grown materials may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fins 56 may comprise silicon germanium ($Si_xGe_{1-x}$, where x can be between approximately 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 6A:
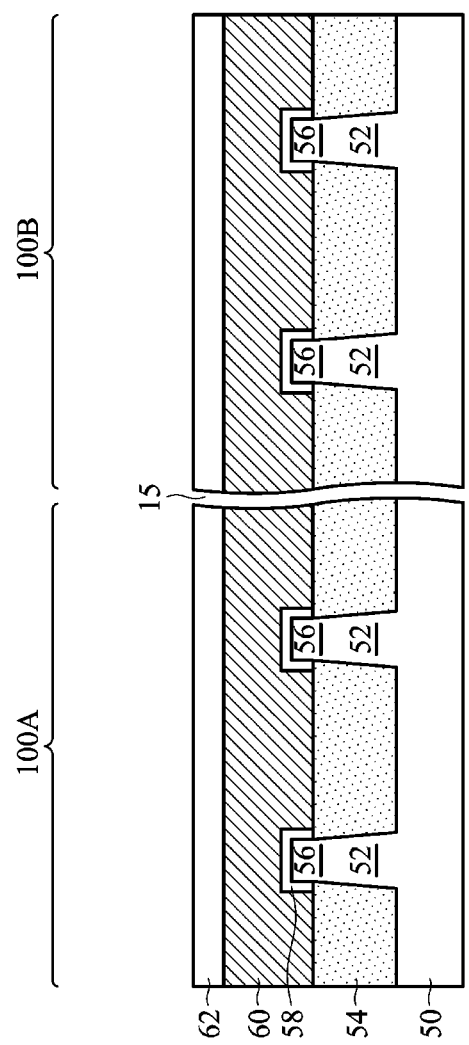

In FIGS. 6A and 6B, a dummy dielectric layer 58 is formed on the fins 56. The dummy dielectric layer 58 may be, for example, silicon oxide, silicon nitride, a combination thereof, or the like, and may be deposited (using, for example, CVD, PVD, or the like) or thermally grown (for example, using thermal oxidation or the like) according to acceptable techniques. A dummy gate layer 60 is formed over the dummy dielectric layer 58, and a mask layer 62 is formed over the dummy gate layer 60. The dummy gate layer 60 may be deposited over the dummy dielectric layer 58 and then planarized, such as by a CMP. The mask layer 62 may be deposited over the dummy gate layer 60. The dummy gate layer 60 may be made of, for example, polysilicon, although other materials that have a high etching selectivity from the etching of isolation regions 54 may also be used. The mask layer 62 may include, for example, silicon nitride or the like. In this example, a single dummy gate layer 60 and a single mask layer 62 are formed across the first region 100A and the second region 100B. In other embodiments, separate dummy gate layers may be formed in the first region 100A and the second region 100C, and separate mask layers may be formed in the first region 100A and the second region 100B.

Figure 7A:
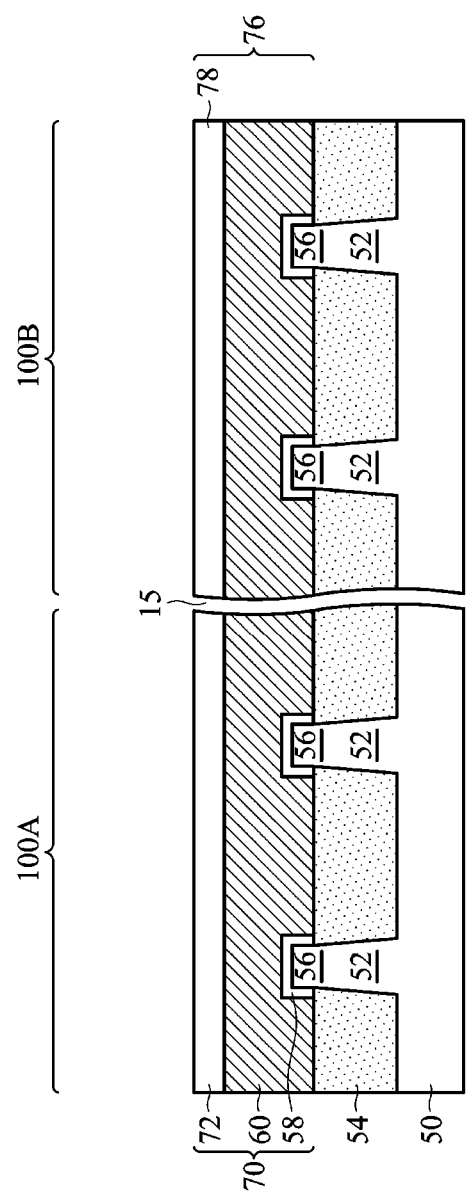
FIGS. 7A, 7B and 7C are cross-sectional views of intermediate stages in the manufacture of a finFET device in accordance with some embodiments.
Figure 7B:
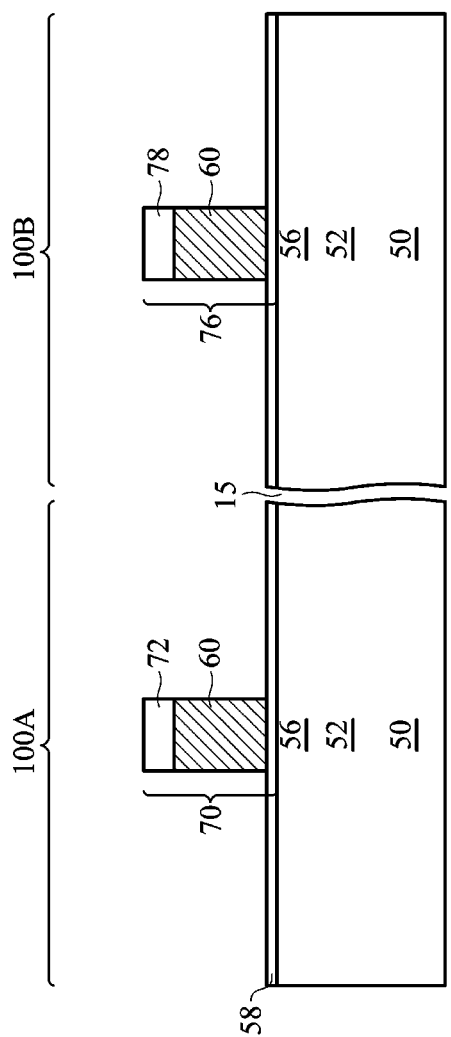
Figure 7C:
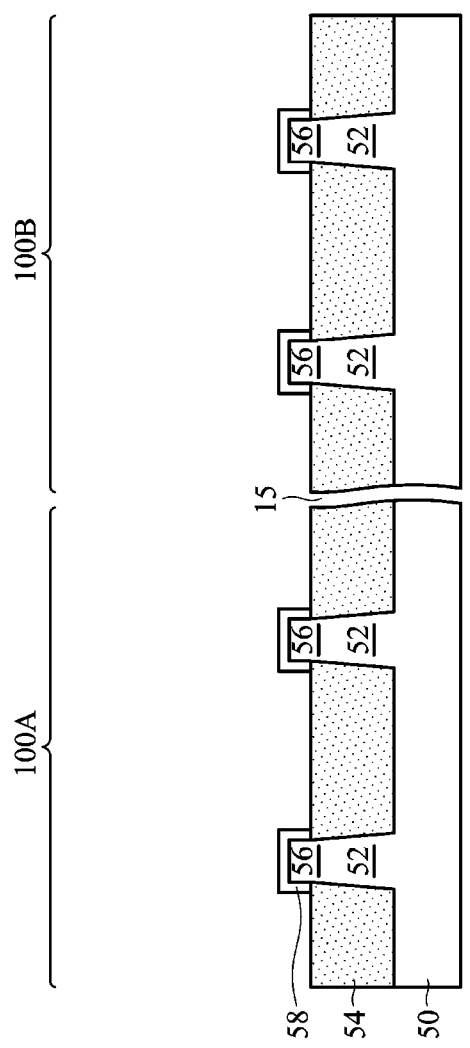

In FIGS. 7A, 7B, and 7C, the mask layer 62 may be patterned using acceptable photolithography and etching techniques to form mask 72 in the first region 100A and mask 78 in the second region 100B. The pattern of the masks 72 and 78 then may be transferred to the dummy gate layer 60 by an acceptable etching technique to form dummy gates 70 in the first region 100A and dummy gates 76 in the second region 100B. Optionally, the pattern of masks 72 and 78 may similarly be transferred to dummy dielectric layer 58. The dummy gates 70 and 76 cover respective channel regions of the fins 56. The dummy gates 70 and 76 may also have a lengthwise direction substantially perpendicular to the lengthwise direction of respective epitaxial fins.

Furthermore, although not explicitly illustrated, masks 72 and 78 may further be used to pattern dummy gate layer 60 and optionally dummy dielectric layer 58 in cross section A-A of FIGS. 1 and 7A. Specifically, the dummy gate layer 60 may be patterned to physically separate dummy gates of adjacent finFET devices within each region 100A and 100B. For example, dummy gates 70 and 76 may be physically separated from each other as well as dummy gates of adjacent finFET devices (not explicitly illustrated). In other embodiments, different masks (e.g., other than masks 72 and 78) may be used to pattern the dummy gate layer 60 in different cross sections (e.g., cross section A-A versus cross section B-B of FIGS. 1, 7A, and 7B). A size of the dummy gates 70 and 76, and a pitch between dummy gates 70 and 76, may depend on a region of a die in which the dummy gates are formed. In some embodiments, dummy gates 70 and 76 may have a larger size and a larger pitch when located in an input/output region of a die (e.g., where input/output circuitry is disposed) than when located in a logic region of a die (e.g., where logic circuitry is disposed).

In FIGS. 7A, 7B and 7C, appropriate wells (not shown) may be formed in the fins 56, semiconductor strips 52, and/or substrate 50. For example, a P well may be formed in the first region 100A, and an N well may be formed in the second region 100B.

The different implant steps for the different regions 100A and 100B may be achieved using a photoresist or other masks (not shown). For example, a photoresist is formed over the fins 56 and the isolation regions 54 in the second region 100B. The photoresist is patterned to expose the second region 100B of the substrate 50, such as a PMOS region. The photoresist can be formed by using a spin-on technique and can be patterned using acceptable photolithography techniques. Once the photoresist is patterned, an n-type impurity implant is performed in the second region 100B, and the photoresist may act as a mask to substantially prevent n-type impurities from being implanted into the first region 100A, such as an NMOS region. The n-type impurities may be phosphorus, arsenic, or the like implanted in the first region to a concentration of equal to or less than $10^{18}$ $cm^{-3}$, such as in a range from about $10^{17}$ $cm^{-3}$ to about $10^{18}$ $cm^{-3}$. After the implant, the photoresist is removed, such as by an acceptable ashing process.

Following the implanting of the second region 100B, a photoresist is formed over the fins 56 and the isolation regions 54 in the second region 100B. The photoresist is patterned to expose the first region 100A of the substrate 50, such as the NMOS region. The photoresist can be formed by using a spin-on technique and can be patterned using acceptable photolithography techniques. Once the photoresist is patterned, a p-type impurity implant may be performed in the first region 100A, and the photoresist may act as a mask to substantially prevent p-type impurities from being implanted into the second region, such as the PMOS region. The p-type impurities may be boron, $BF_2$, or the like implanted in the first region to a concentration of equal to or less than $10^{18}$ cm$^{-3}$, such as in a range from about $10^{17}$ cm$^{-3}$ to about $10^{18}$ cm$^{-3}$. After the implant, the photoresist may be removed, such as by an acceptable ashing process.

After the implants of the first region 100A and the second region 100B, an anneal process may be performed to activate the p-type and n-type impurities that were implanted. The implantations may form a p-well in the first region 50B, e.g., the NMOS region, and an n-well in the second region 50C, e.g., the PMOS region. In some embodiments, the grown materials of epitaxial fins may be in situ doped during growth, which may obviate the implantations, although in situ and implantation doping may be used together.

Figure 8A:
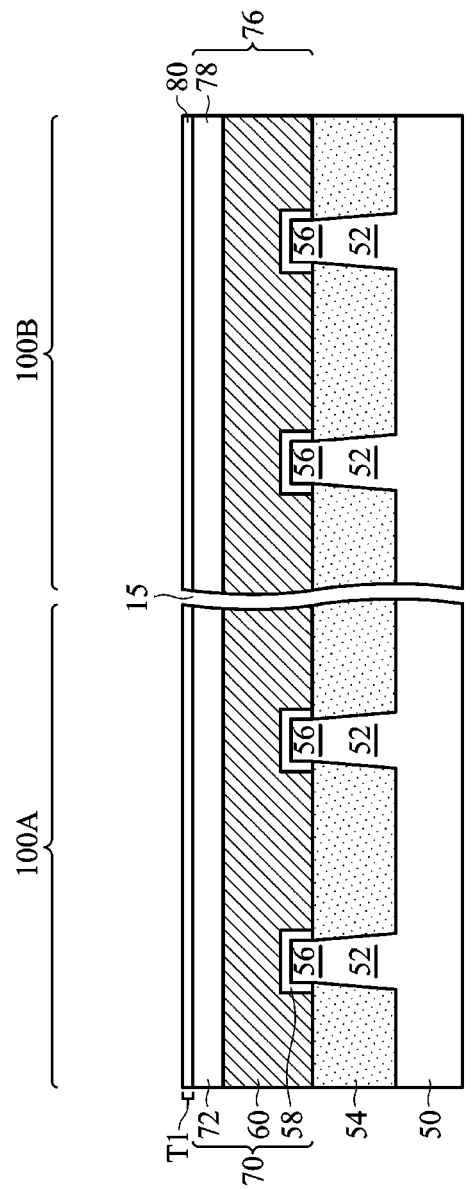
FIGS. 8A, 8B and 8C are cross-sectional views of intermediate stages in the manufacture of a finFET device in accordance with some embodiments.
Figure 8B:
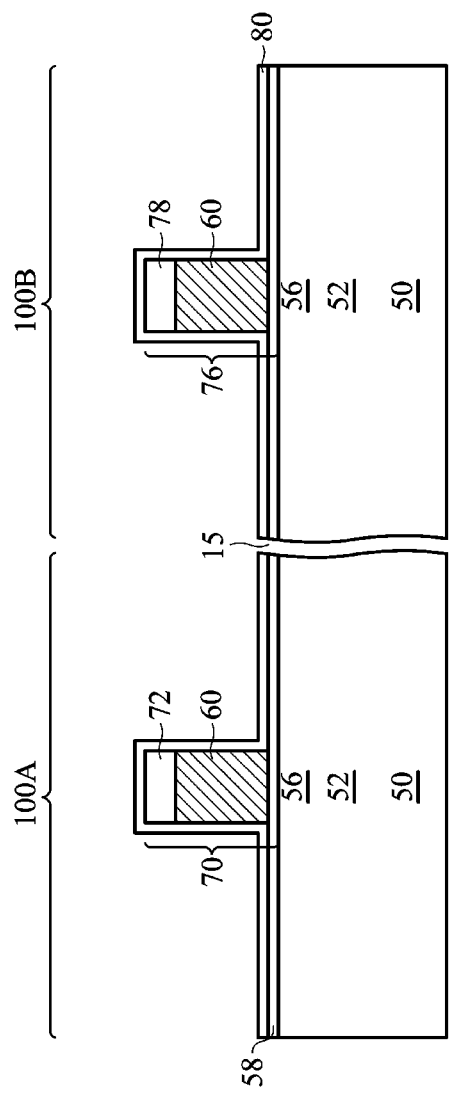
Figure 8C:
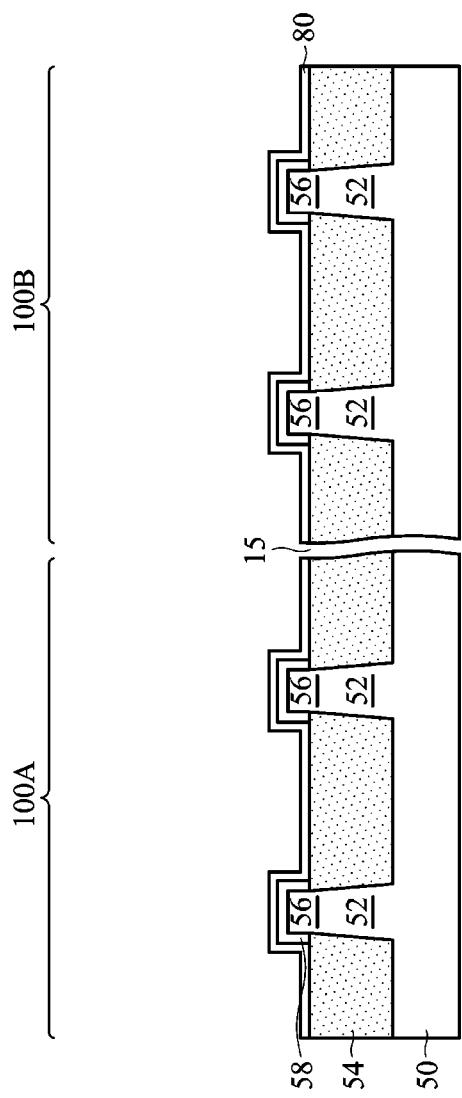

In FIGS. 8A, 8B, and 8C, a first gate spacer 80 is formed on exposed surfaces of respective dummy gates 70 and 76 (FIGS. 8A and 8B) and/or dummy dielectric layer 58 over fins 56 (FIG. 8C). Any suitable methods of forming gate spacers 80 may be used. In some embodiments, a deposition (such as CVD, ALD or the like) may be used form the first gate spacer 80. In some embodiments, as shown in FIG. 8A, first gate spacer may have a thickness T1 of about 30 Å. First gate spacer 80 may comprise any suitable material. In some embodiments, first gate spacer may comprise SiOCN.

Figure 9A:
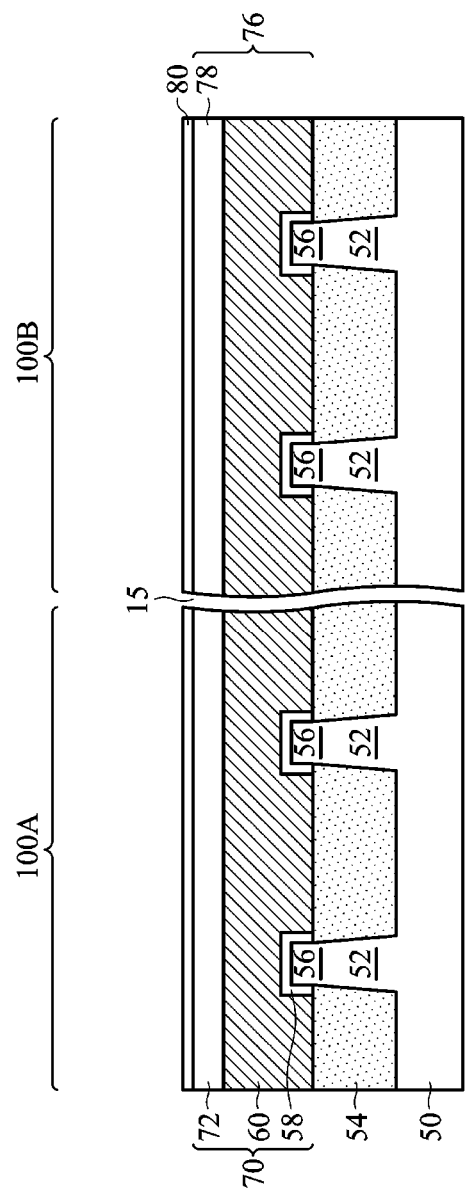
FIGS. 9A, 9B and 9C are cross-sectional views of intermediate stages in the manufacture of a finFET device in accordance with some embodiments.
Figure 9B:
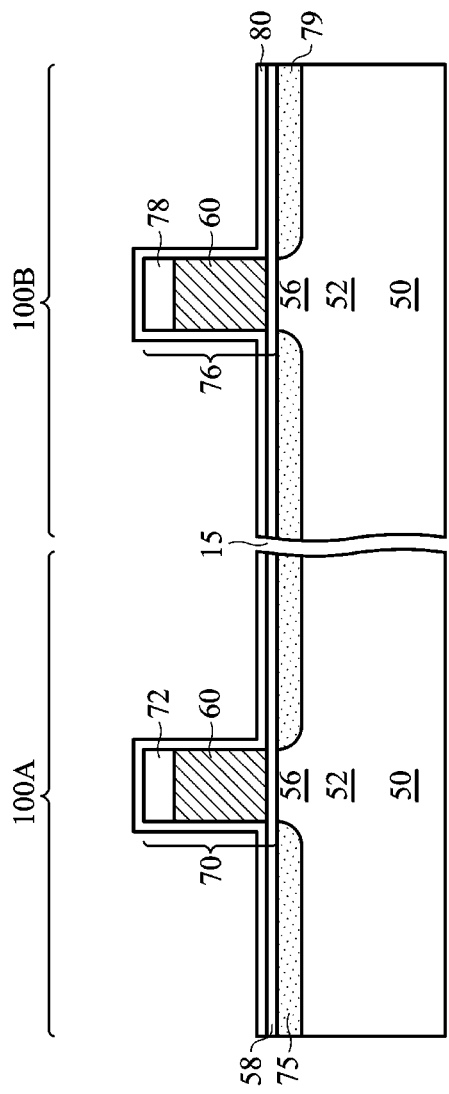
Figure 9C:
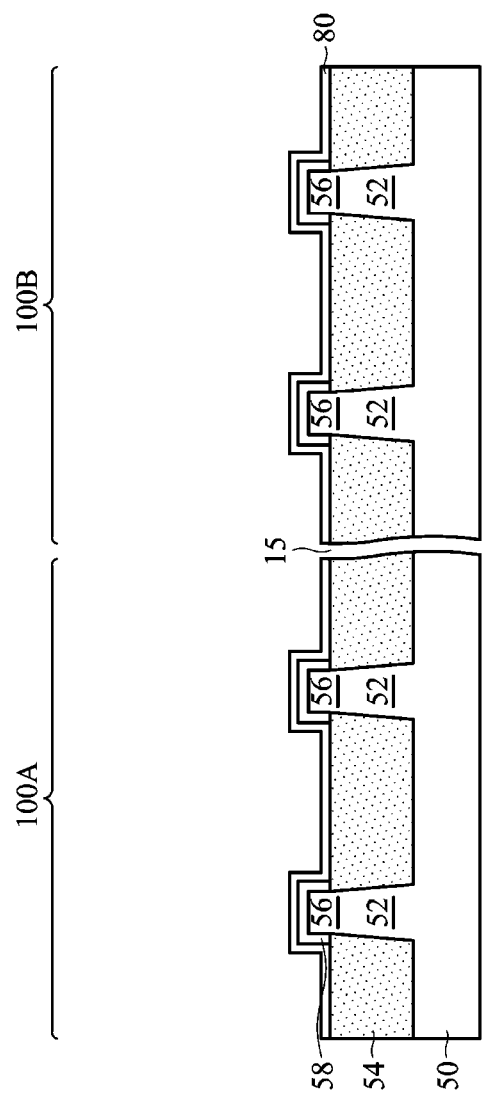

In FIGS. 9A, 9B and 9C, implants for lightly doped source/drain (LDD) regions 75 and 79 may be performed. Similar to the implants discussed above in FIGS. 7A, 7B and 7C, a mask (not shown), such as a photoresist, may be formed over the first region 100A, e.g., NMOS region, while exposing the second region 100B, e.g., PMOS region, and p-type impurities may be implanted into the exposed fins 56 in the second region 100B to created LDD regions 79. The mask may then be removed. Subsequently, a mask (not shown), such as a photoresist, may be formed over the second region 100B while exposing the first region 100A, and n-type impurities may be implanted into the exposed fins 56 in the first region 100A to create LDD regions 75. The mask may then be removed. The n-type impurities may be the any of the n-type impurities previously discussed, and the p-type impurities may be the any of the p-type impurities previously discussed. The LDD regions 75 and 79 may each have a concentration of impurities of from about $10^{15}$ cm$^{-3}$ to about $10^{16}$ cm$^{-3}$. An anneal process may be used to activate the implanted impurities.

Next, referring to FIGS. 10A-D, a carbon treatment 101 may be performed on first gate spacer 80. Carbon treatment 101 may help to protect subsequently formed epitaxially grown source/drain regions from damage during subsequent processing steps. For example, in subsequent processing steps source/drain regions will be epitaxially grown (see FIGS. 14A-C and 17A-C). After the source/drain regions are epitaxially grown, dummy gates 70/76 and (optionally) dummy dielectric layer 58 may be removed, for example using a wet cleaning process (See FIGS. 21A-C), and replacement gates may be formed. During the wet cleaning process to remove dummy gates 70/76 and dummy dielectric layer 58, the chemicals used to perform the wet cleaning may penetrate through the first gate spacer 80, and any other gate spacers that are present, and may cause damage to epitaxially grown source/drain regions formed before dummy gate removal process. For example, the wet cleaning process may use $NH_4OH$, and the $NH_4OH$ may penetrate through at least the first gate spacer 80 and cause damage to the source/drain regions. Carbon treatment 101 may strengthen first gate spacer 80 and help to prevent or minimize the penetration of the wet cleaning chemical, such as $NH_4OH$, through first gate spacer 80, and therefore may prevent or minimize damage to the source/drain regions caused by the wet cleaning chemical. Carbon treatment 101 may also enable a reduction or elimination of damage to source/drain regions caused by the wet cleaning chemical without the need to increase a thickness of the first gate spacer 80, which may degrade the electrical performance of the finFET and reduce the size of the process window. Finally, carbon treatment 101 may reduce an etch rate of dummy dielectric 58.

Figure 10A:
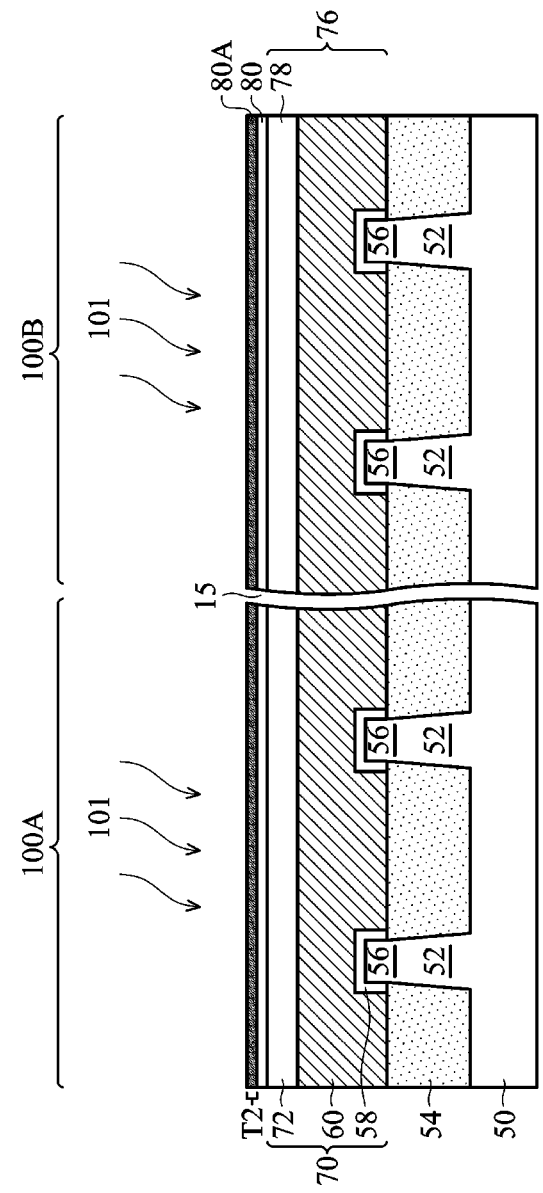
FIGS. 10A, 10B, and 10C are cross-sectional views of intermediate stages in the manufacture of a finFET device in accordance with some embodiments.
Figure 10B:
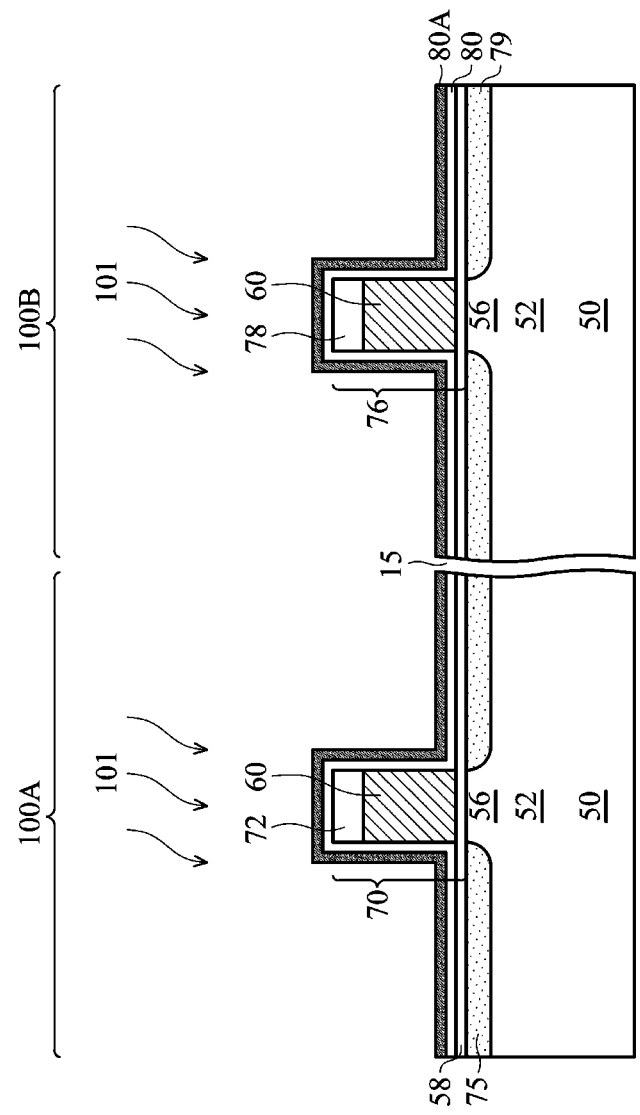
Figure 10C:
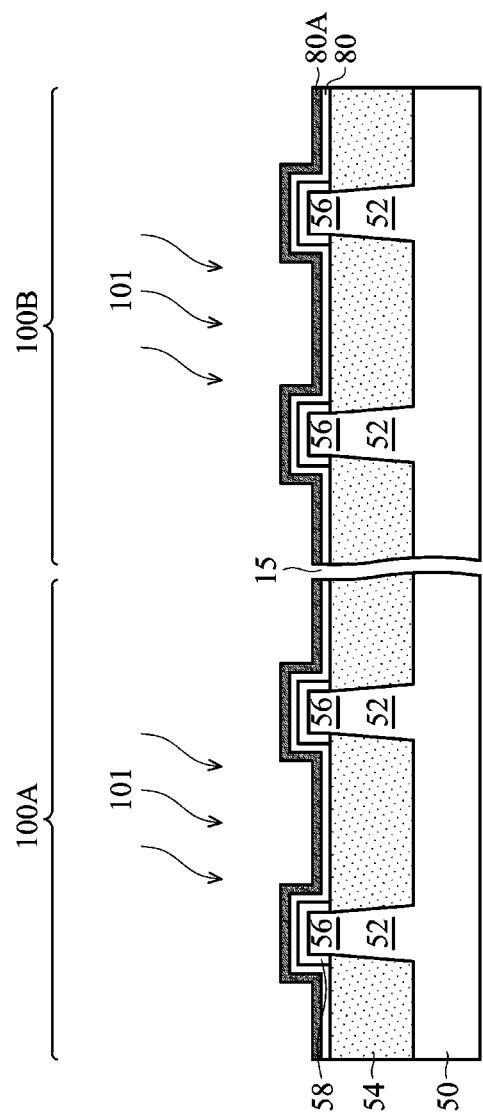
Figure 10D:
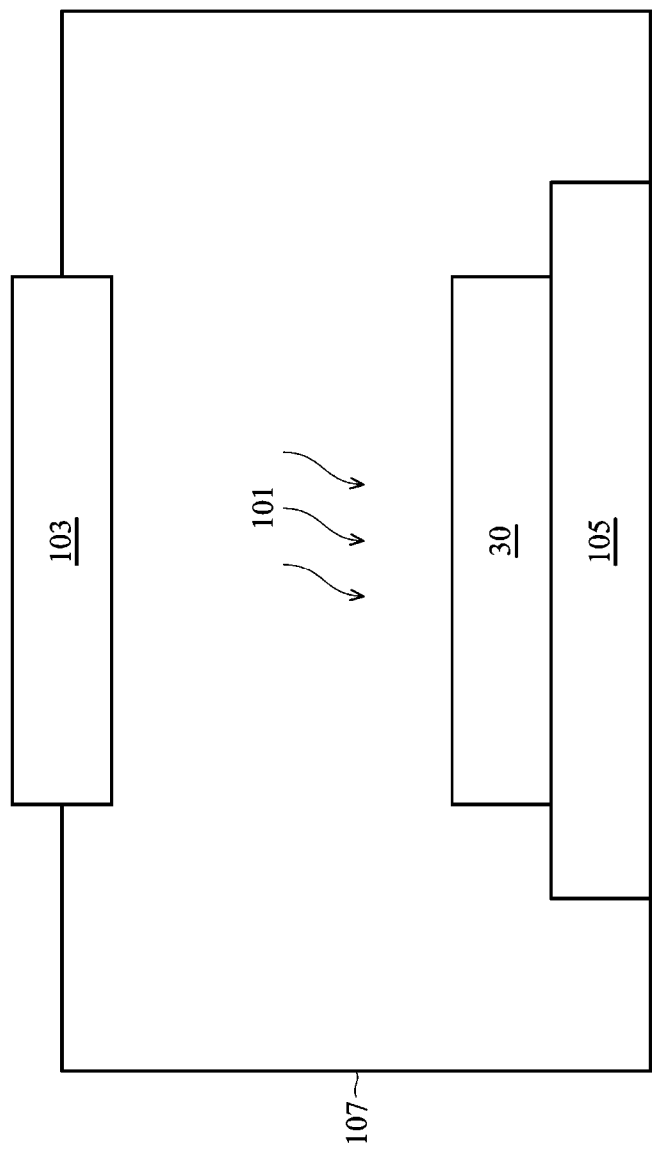
FIG. 10D is a cross-sectional depiction of a finFET device in a process chamber in accordance with some embodiments.

Referring to FIG. 10D, in some embodiments carbon treatment 101 comprises placing the wafer on which finFET 30 is being formed in a plasma chamber 107 on a wafer chuck 105 under RF coil 103. Any suitable plasma chamber 107 may be used. For example, the VARIAN VIISTA® PLAD from Applied Materials may be suitable for use in some embodiments. A carbon plasma conformal doping may be performed on the finFET 30 in plasma chamber 107 using a gas source and an RF coil that are configured to create carbon plasma in the plasma chamber 107. In some embodiments, the gas source generates a gas during the carbon plasma conformal doping. The gas may be a carbon hydride in some embodiments, such as $CH_4$, $C_2H_2$, $C_2H_4$, or $C_2H_6$. The gas from the gas source may be applied at a concentration of about 100%. A power of about 300 W to about 2000 W, a bias of about 0.1 kV to about 3 kV, and a pressure of about 5 mT to about 50 mT may be applied to the plasma chamber during carbon treatment 101. Plasma containing carbon ions is created in the plasma chamber 107, and the carbon ions are targeted toward the finFET 30 and implanted in exposed surfaces of finFET 30 according to the process parameters of the plasma chamber 107.

In some embodiments, the use of a carbon plasma conformal doping of gate spacers 80 may enable a more uniform doping of gate spacers 80. For example, it may be possible to dope gate spacers 80 using beamline implantation. However, due to high aspect ratios of some dummy gates, a line of sight from the beamline to all areas of the first gate spacer 80 may be unavailable. Therefore, a beamline implantation may result in a failure to dope some sections of first gate spacer 80, leading to a non-uniform doping of first gate spacer 80. The use of a carbon plasma conformal doping of first gate spacer 80 may allow for a more uniform doping of first gate spacer 80. For example, after carbon treatment 101, first gate spacer 80 a carbon concentration in first gate spacer 80 may be substantially similar in different sections of first gate spacer 80. In some embodiments, a carbon concentration in sections of first gate spacer 80 that extend along upper surfaces of dummy gates 70 and 76 may be substantially the same as a carbon concentration of sections of first gate spacer 80 that extend along sidewalls of dummy gates 70 and 76.

Referring to FIGS. 10A-C, after the carbon treatment 101 first gate spacer 80 may have increased amounts of carbon. After the carbon treatment 101, carbon may be present in first gate spacer 80 in a concentration from about 5% to about 30%. The presence of carbon in first gate spacer 80 in a concentration of 5% to 30% may enable first gate spacer 80 to prevent or minimize the penetration of the wet cleaning chemical, such as $NH_4OH$, through first gate spacer 80, and therefore may prevent or minimize damage to the source/drain regions caused by the wet cleaning chemical. The carbon plasma conformal doping may allow greater concentrations of carbon to be doped into the first gate spacer 80 than would be possible using other conventional methods, such as ALD.

After the carbon treatment 101 a thin film of carbon 80A may have built up on a surface of first gate spacers 80 to which the carbon plasma was incident during the carbone treatment 101. Carbon film 80A may have a thickness T2 of about 10 Å to about 70 Å, such as about 30 Å, as shown in FIG. 10A. In some embodiments, after the carbon treatment 101 first gate spacer 80 may have a gradient of carbon density, with a greatest density of carbon being present at the surface of the first gate spacer 80 to which carbon plasma was incident during the carbon treatment 101 and a smallest density of carbon being present at the surface of the first gate spaces 80 that is opposite to the surface to which carbon plasma was incident during the carbon treatment 101. In some embodiments carbon treatment 101 may result in increased carbon concentration in dummy dielectric layer 58. For example, in some embodiments increased carbon may penetrate a distance into dummy dielectric layer 58 of about 0.5 nm to about 2.5 nm.

FIGS. 10A-D depict embodiments in which carbon treatment 101 is performed after LDD regions 75 and 79 are formed. (See FIGS. 9A-C). In some embodiments, carbon treatment 101 may be performed after the forming of first gate spacer 80 (See FIGS. 8A-C) but before the forming of LDD regions 75 and 79.

Figure 11A:
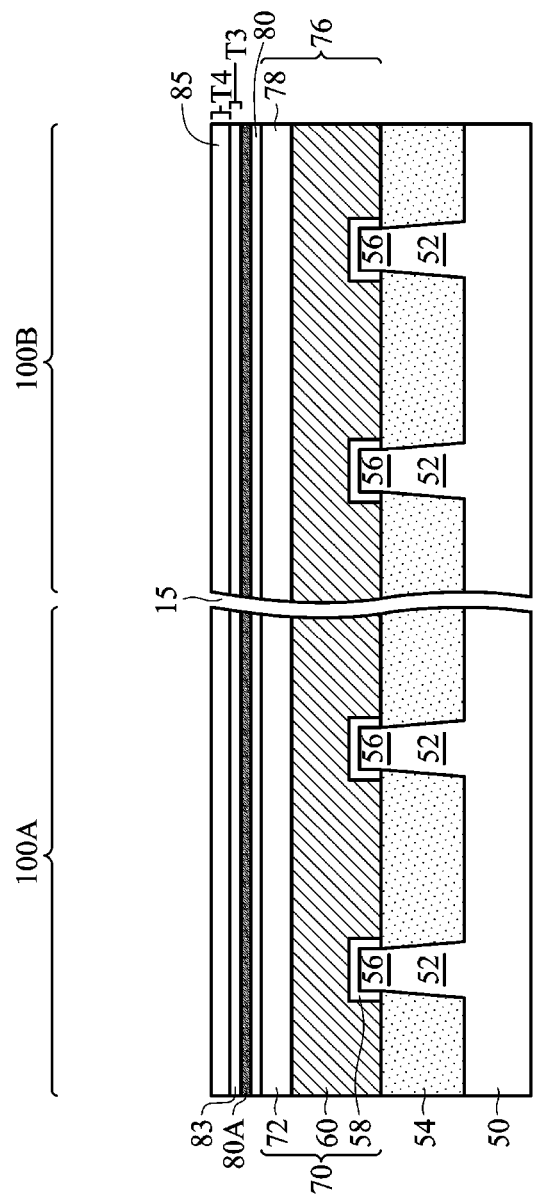
FIGS. 11A, 11B, and 11C are cross-sectional views of intermediate stages in the manufacture of a finFET device in accordance with some embodiments.
Figure 11B:
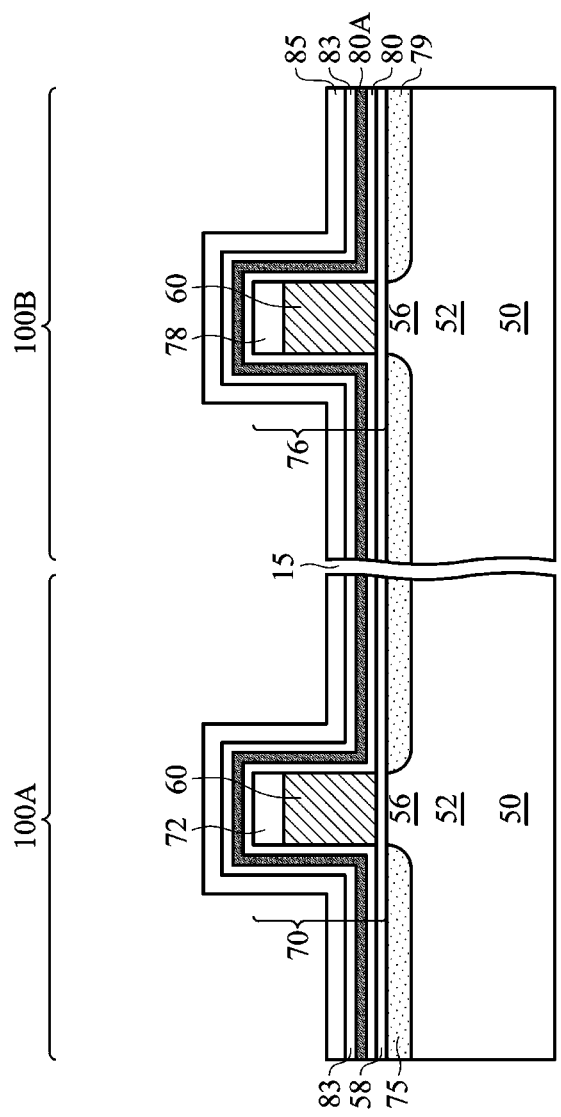
Figure 11C:
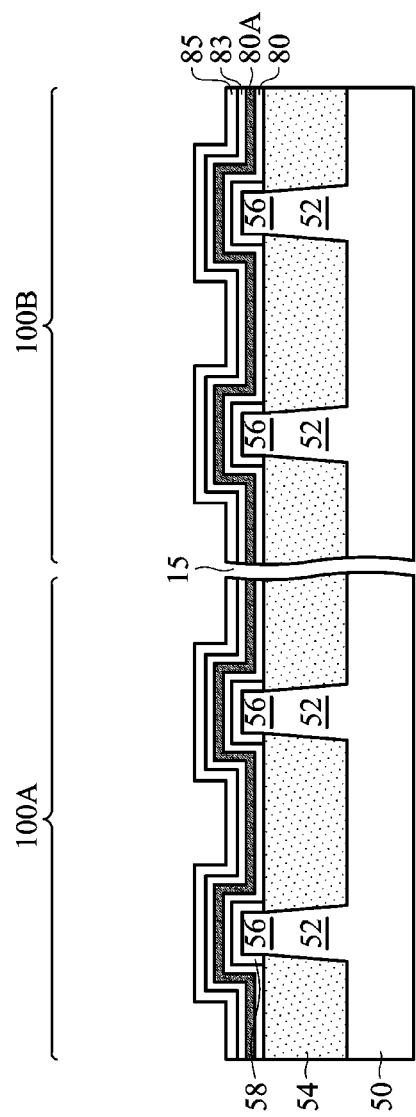

Referring to FIGS. 11A-C, additional gate spacers may be formed over gate spacer 80 and carbon film 80A. First, second gate spacer 83 may be formed over first gate spacer 80 and carbon film 80A. Any suitable methods of forming second gate spacer 83 may be used. In some embodiments, a deposition (such as ALD, CVD, or the like) may be used form second gate spacer 83. Any suitable material may be used to form second gate spacer 83. In some embodiments, second gate spacer 83 may comprise SiOCN. As shown in FIG. 11A, in some embodiments, second gate spacer 83 may have a thickness T3 of about 30 Å. After second gate spacer 83 is formed, third gate spacer 85 is formed over second gate spacers 83. Any suitable methods of forming third gate spacer 85 may be used. In some embodiments, a deposition (such as ALD, CVD, or the like) may be used form third gate spacers 85. Any suitable material may be used to form third gate spacer 85. In some embodiments, third gate spacer 85 may comprise SiN. Third gate spacer 85 may have a thickness T4 of about 40 Å in some embodiments, as shown in FIG. 11A.

Figure 12A:
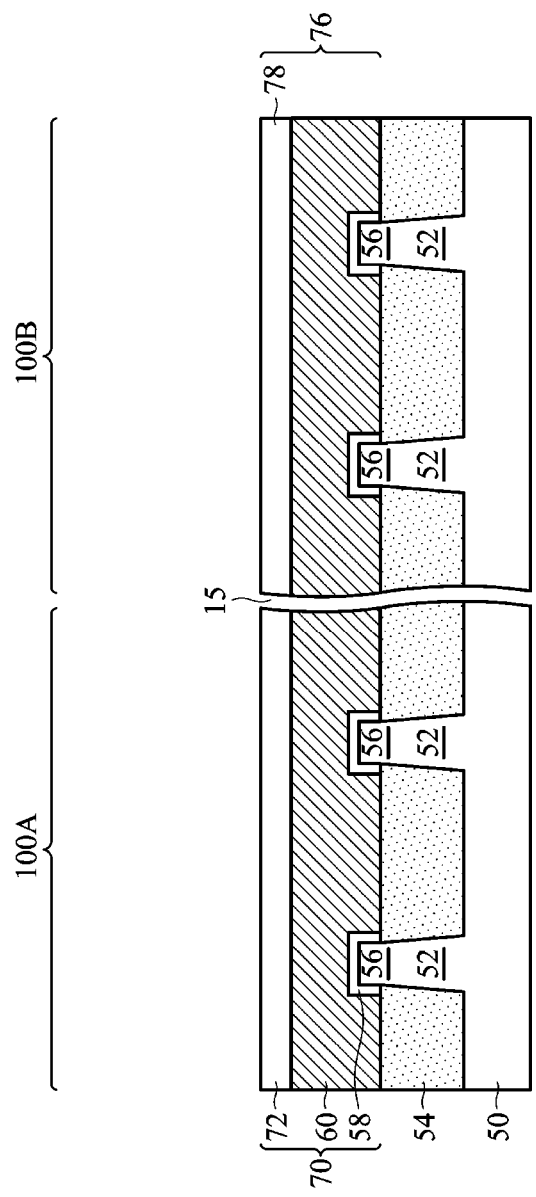
FIGS. 12A, 12B, and 12C are cross-sectional views of intermediate stages in the manufacture of a finFET device in accordance with some embodiments.
Figure 12B:
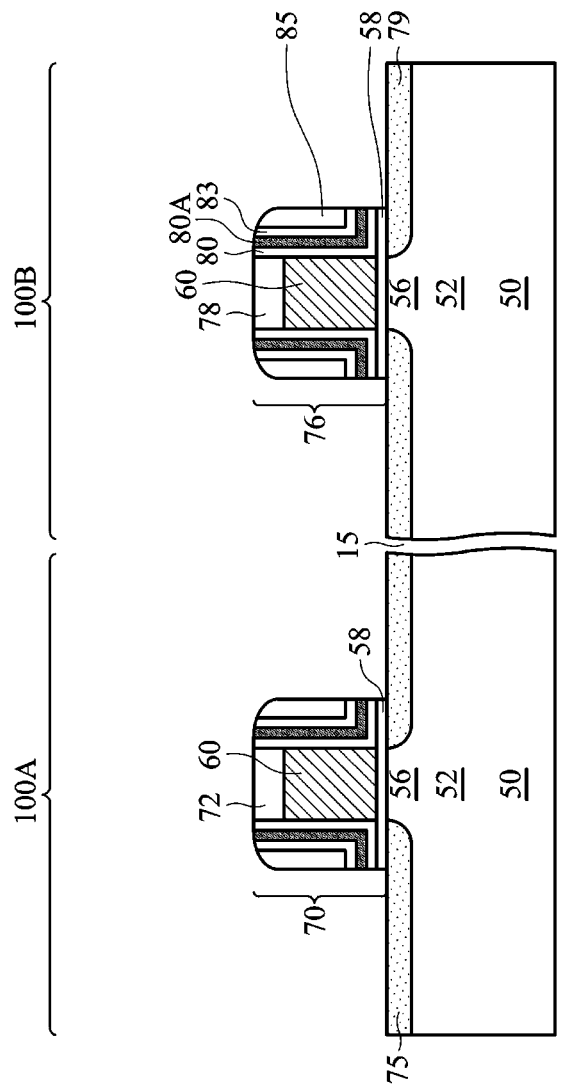
Figure 12C:
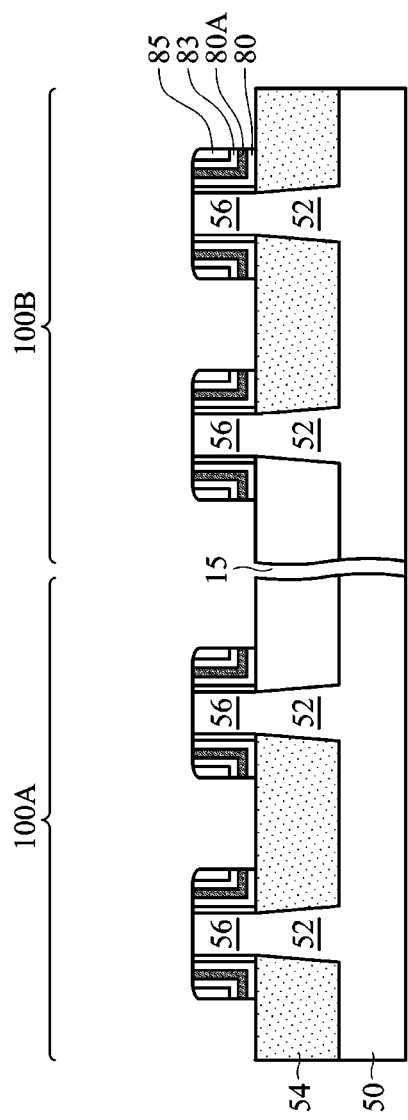

Next, a patterning process is performed to remove excess sections of first gate spacer 80, carbon film 80A, second gate spacer 83 and third gate spacer 85. Any acceptable patterning process may be used. In some embodiments a photoresist may be deposited (not shown) and patterned using acceptable lithograph techniques, where openings in the photo resist expose sections of first gate spacer 80, carbon film 80A, second gate spacer 83 and third gate spacer 85 to be removed. An etching process may be performed using the photoresist as a mask. The etching process may be anisotropic. After the etching, sections of first gate spacer 80, carbon film 80A, second gate spacer 83 and third gate spacer 85 over LDD regions and over isolation regions 54 may be removed. The resulting structure is depicted in FIGS. 12A-C.

FIGS. 13A-C through 18 depict the formation of epitaxial source/drain regions 82 and 84 in first region 100A and second region 100B. In some embodiments, epitaxial source/drain regions 82 in first region 100A may be formed before epitaxial source/drain regions 84 are formed in second region 100B. It is also possible to form epitaxial source/drain regions 84 in second region 100B before forming epitaxial source/drain regions 82 in first region 100A.

FIGS. 13A-C through 14 depict the formation of an epitaxial source/drain region in first region 100A. During the formation of the epitaxial source/drain region in first region 100A, e.g., the NMOS region, the second region 100B, e.g., the PMOS region may be masked (not shown).

Figure 13A:
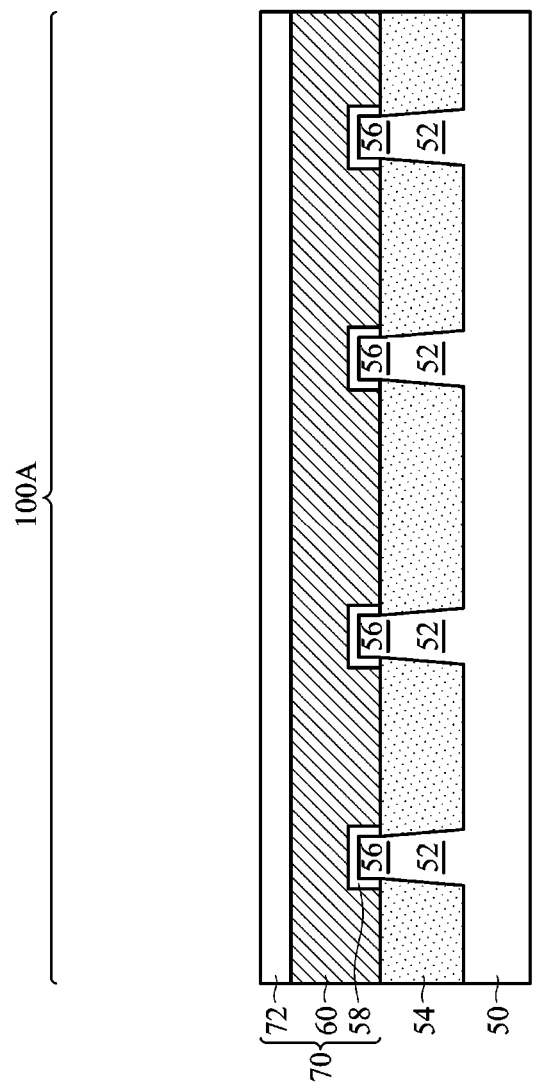
FIGS. 13A, 13B, and 13C are cross-sectional views of intermediate stages in the manufacture of a finFET device in accordance with some embodiments.
Figure 13B:
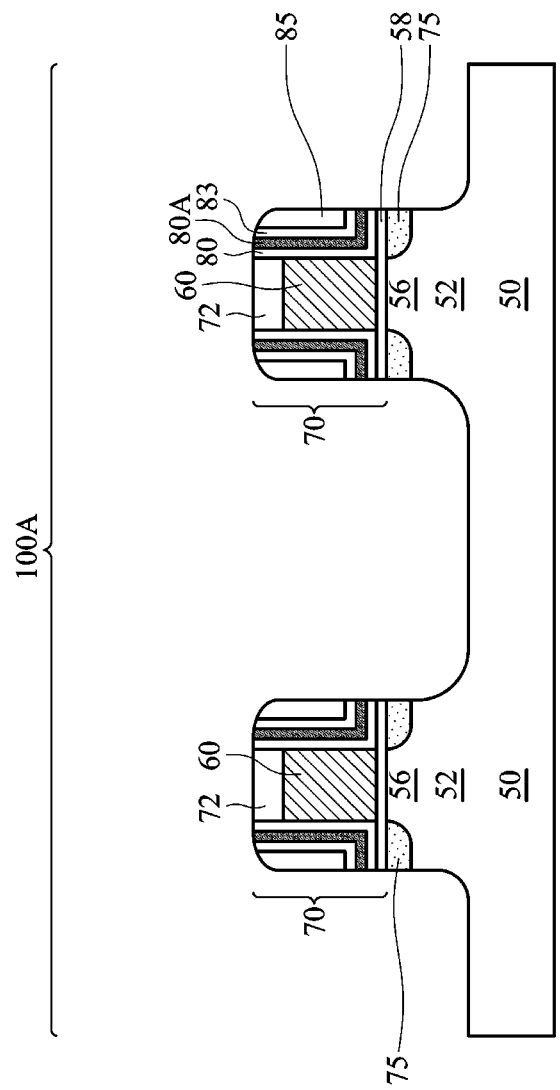
Figure 13C:
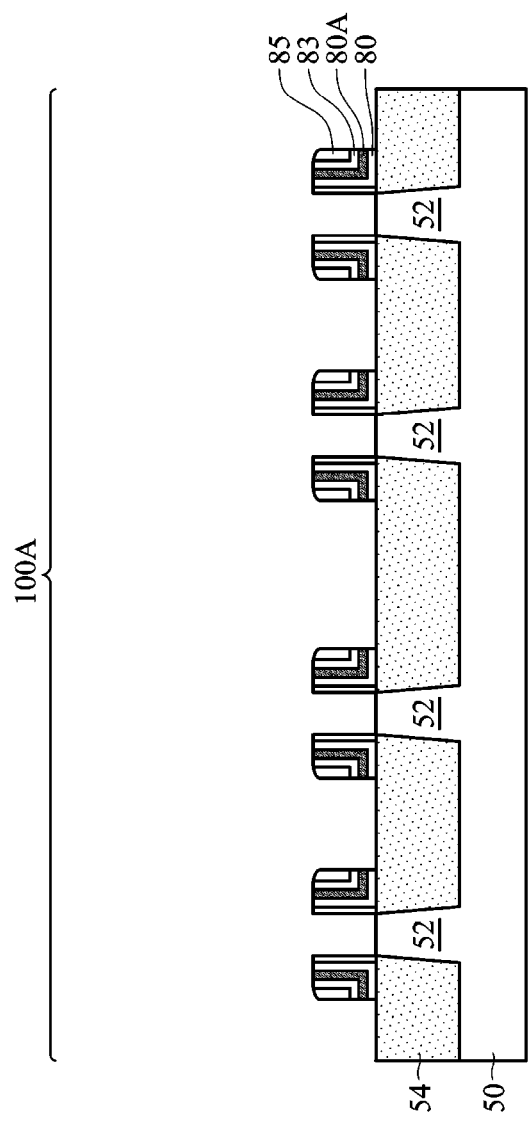

Referring to FIGS. 13A-C, source/drain regions of the fins 56 in the first region 100A are etched to form recesses. The etching may be performed in a manner that a recess is formed between neighboring dummy gates 70. Any acceptable etching process may be used.

Figure 14A:
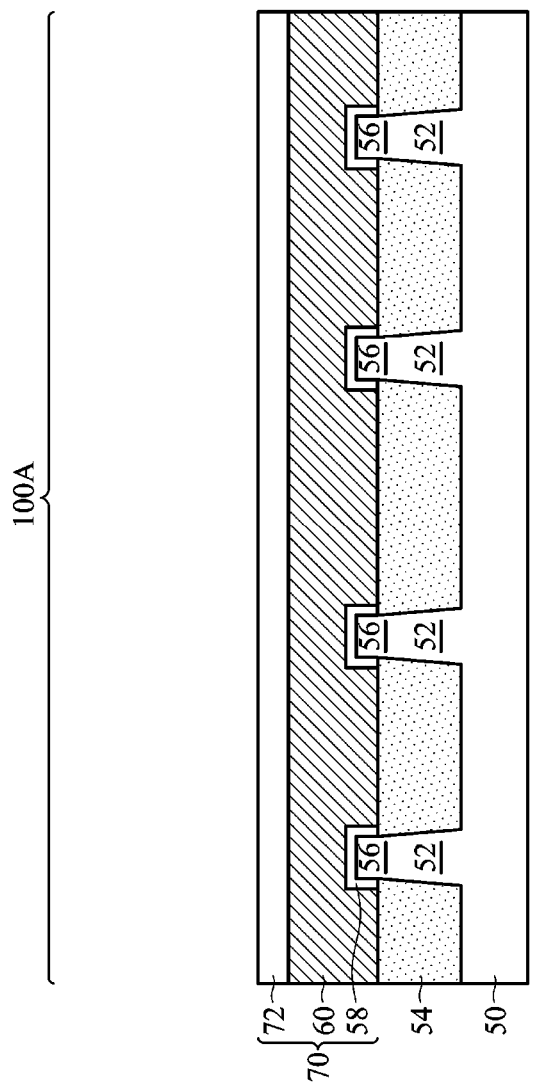
FIGS. 14A, 14B, and 14C are cross-sectional views of intermediate stages in the manufacture of a finFET device in accordance with some embodiments.
Figure 14B:
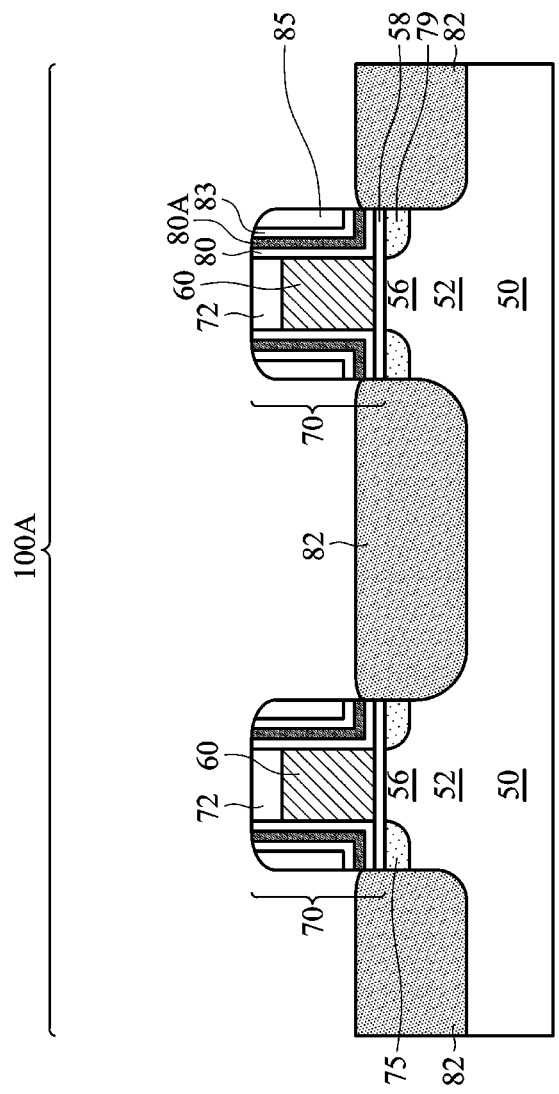
Figure 14C:
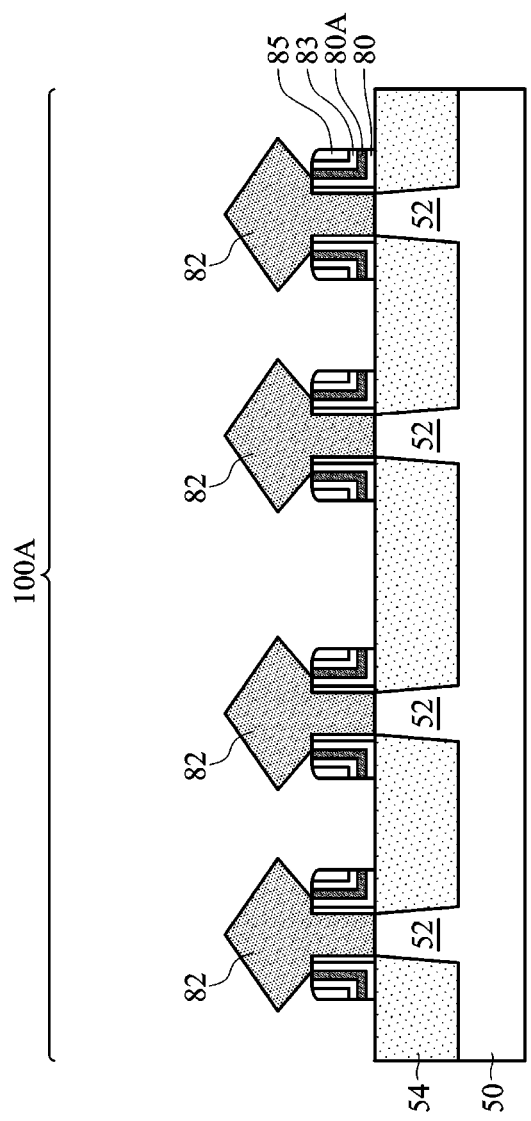
Figure 15:
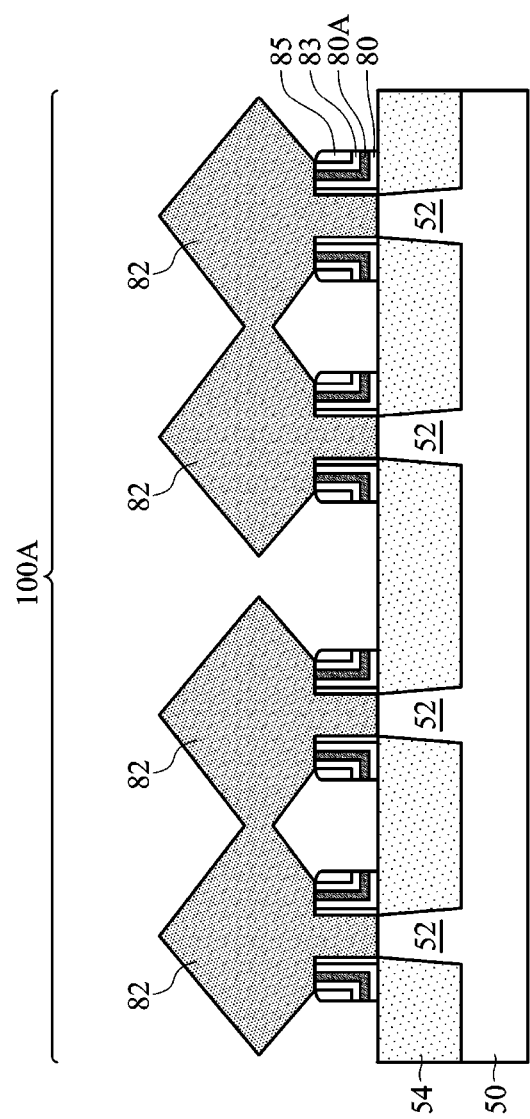
FIG. 15 is a cross-sectional view of an intermediate stage in the manufacture of a finFET device in accordance with some embodiments.

Next, as shown in FIGS. 14A-C, epitaxial source/drain regions 82 in the first region 100A are epitaxially grown in the recesses. The epitaxial source/drain regions 82 may include any acceptable material, such as any material that is appropriate for n-type finFETs. For example, if the fin 56 is silicon, the epitaxial source/drain regions 82 may include silicon, SiC, SiCP, SiP, or the like. The epitaxial source/drain regions 82 may have surfaces raised from respective surfaces of the fins 56 and may have facets. Epitaxial source/drain regions 82 are formed in the fins 56 such that each dummy gate 70 is disposed between respective neighboring pairs of the epitaxial source/drain regions 82 (as depicted in FIG. 14B). In some embodiments the epitaxial source/drain regions 82 may extend past fins 56 and into the semiconductor strips 52.

The epitaxial source/drain regions 82 in the first region 100A may be implanted with dopants to form source/drain regions, similar to the process previously discussed for forming lightly doped source/drain regions, followed by an anneal. The source/drain regions 82 may have an impurity concentration of in a range from about $10^{19}$ cm$^{-3}$ to about $10^{21}$ cm$^{-3}$. The n-type impurities for source/drain regions in the first region 100A, e.g., the NMOS region, may be any of the n-type impurities previously discussed. In other embodiments, the epitaxial source/drain regions 82 may be in situ doped during growth.

FIGS. 14A-C depict embodiments of epitaxial source/drain regions 82 in which each source/drain region 82 is physically separate from other source/drain regions 82. In some embodiments, two or more adjacent source/drain regions 82 may be merged. An embodiment of a finFET having merged source/drain regions is depicted in FIG. 15, which is taken along the C-C cross-section of FIG. 1. In FIG. 15, two adjacent source/drain regions 82 are merged. In some embodiments, more than two adjacent source/drain regions 82 may be merged.

FIGS. 16A-C through 18 depict the formation of epitaxial source/drain regions in second region 100B. During the formation of the epitaxial source/drain region in second region 100B, e.g., the PMOS region, the first region 100A, e.g., the NMOS region may be masked (not shown).

Figure 16A:
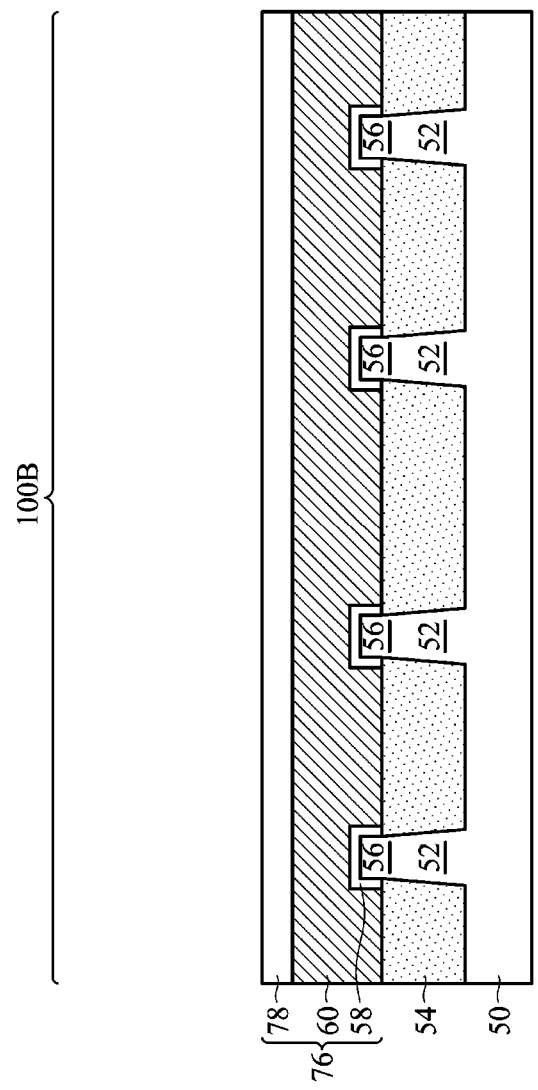
FIGS. 16A, 16B, and 16C are cross-sectional views of intermediate stages in the manufacture of a finFET device in accordance with some embodiments.
Figure 16B:
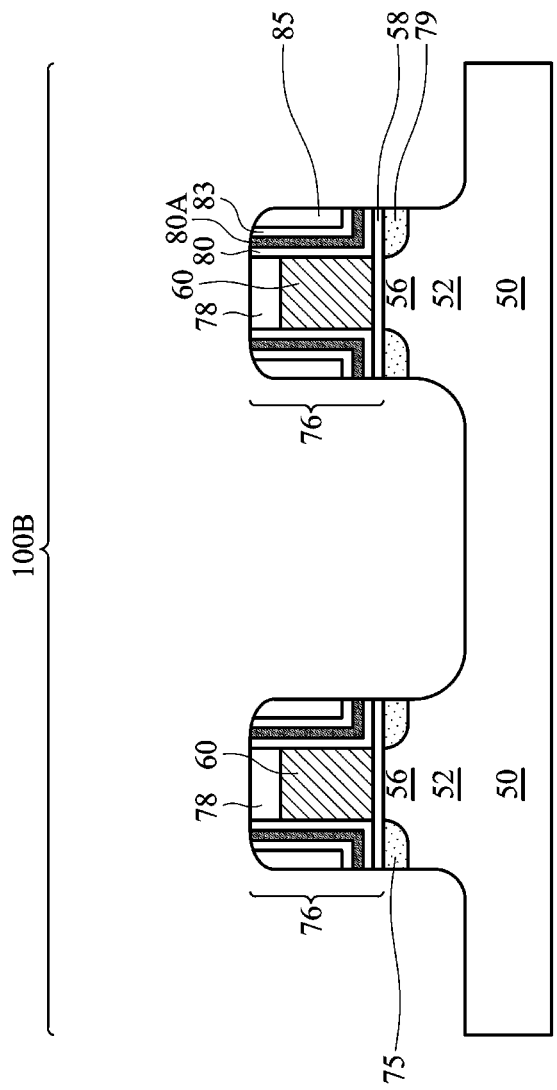
Figure 16C:
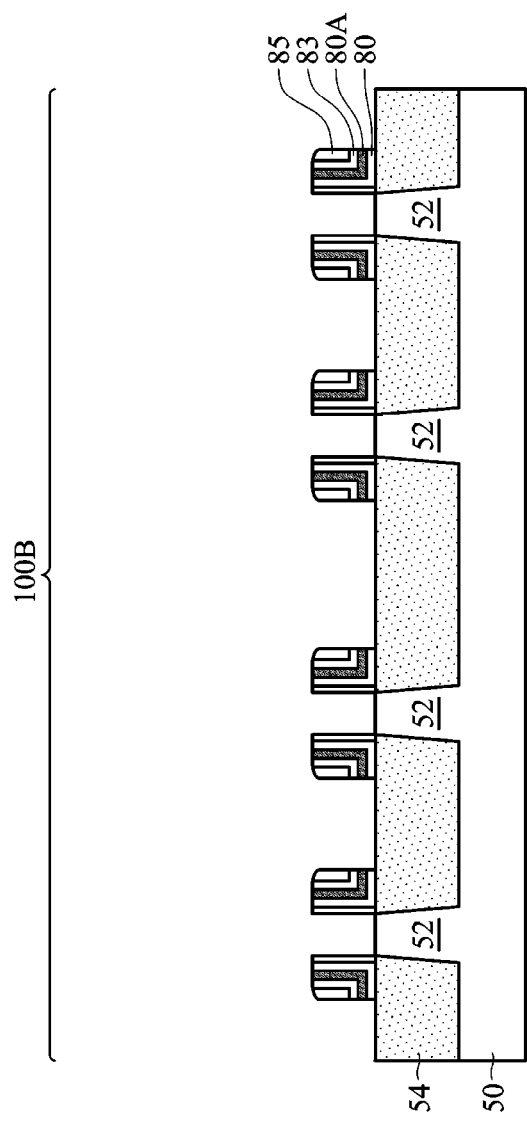

Referring first to FIGS. 16A-C, source/drain regions of the epitaxial fins in the second region 100B are etched to form recesses. The etching may be performed in a manner that a recess is formed between neighboring dummy gates 76, as shown in FIG. 16B. Any acceptable etching process may be used.

Figure 17A:
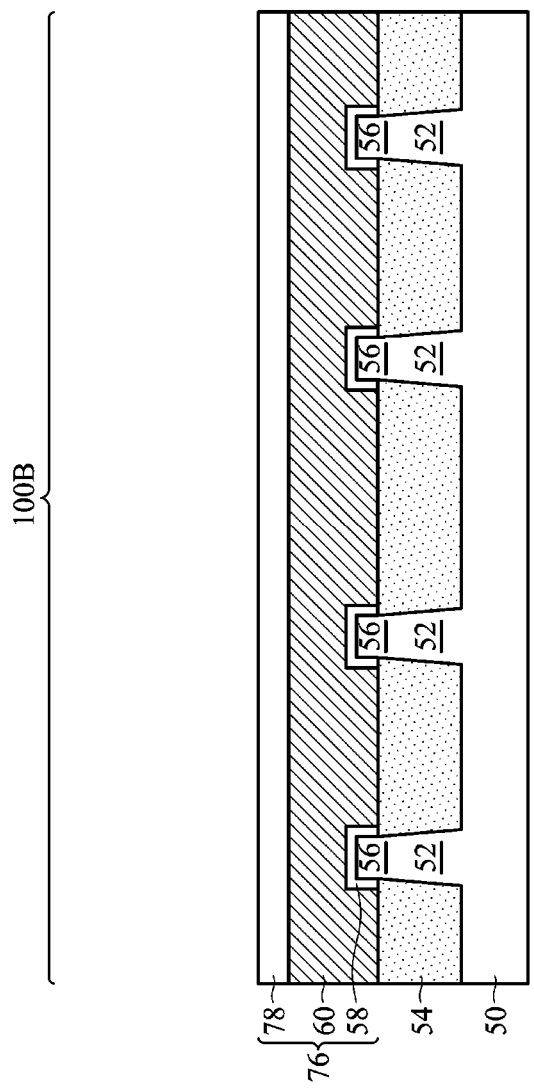
FIGS. 17A, 17B, and 17C are cross-sectional views of intermediate stages in the manufacture of a finFET device in accordance with some embodiments.
Figure 17B:
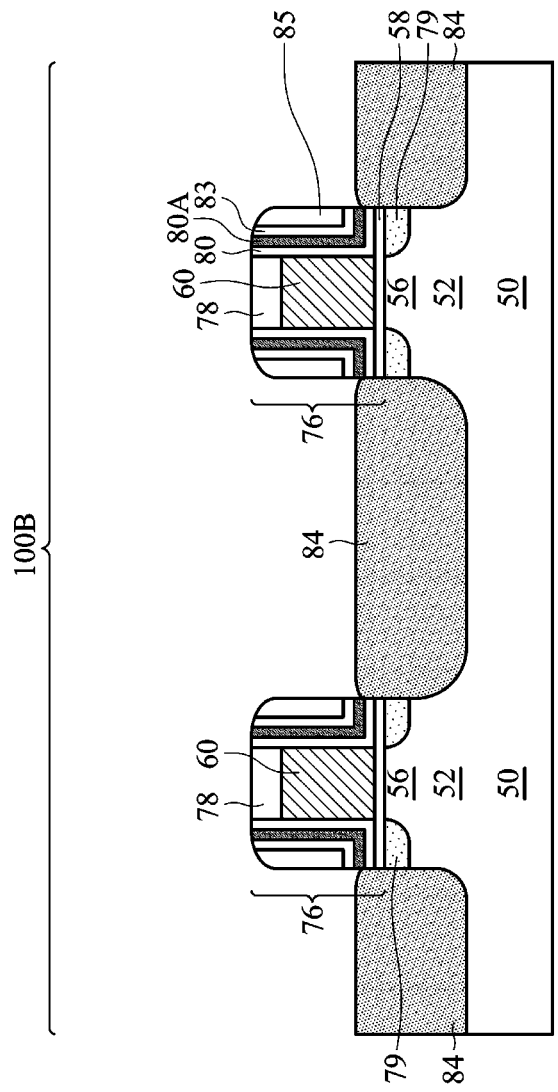
Figure 17C:
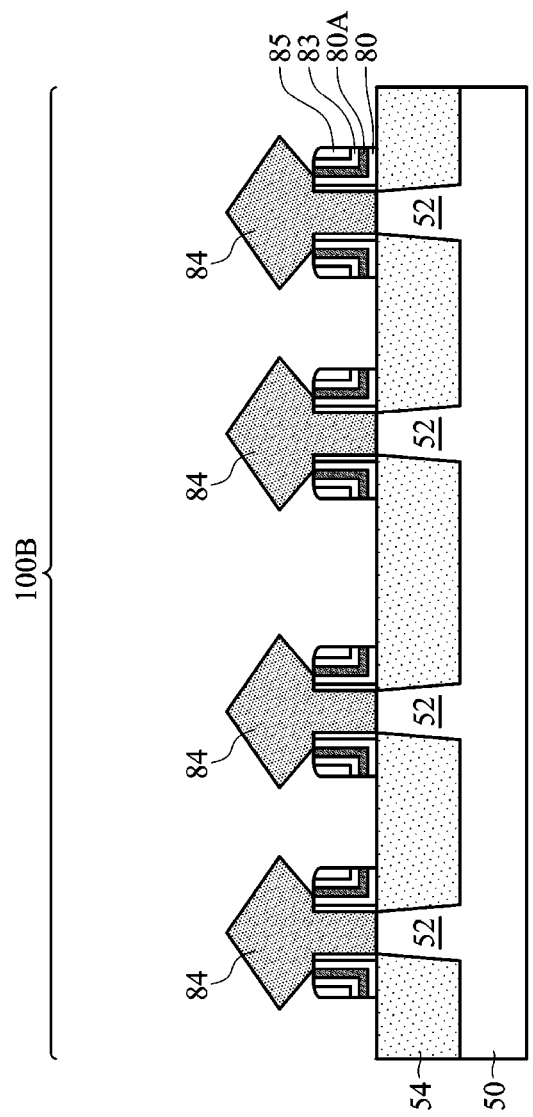
Figure 18:
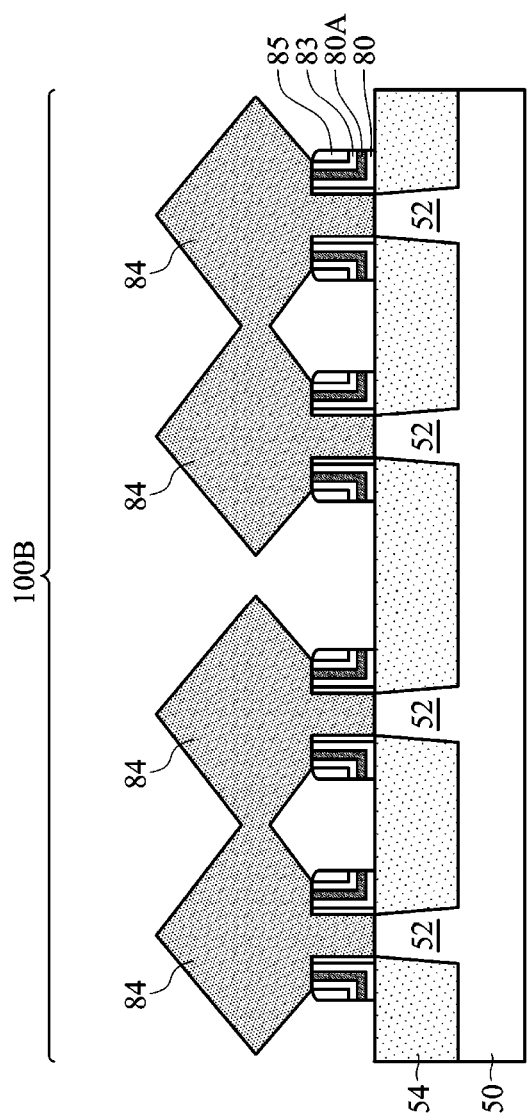
FIG. 18 is a cross-sectional view of an intermediate stage in the manufacture of a finFET device in accordance with some embodiments.

Next, epitaxial source/drain regions 84 in the second region 100B are epitaxially grown in the recesses, as shown in FIGS. 17A-C. The epitaxial source/drain regions 84 may include any acceptable material, such as material that is appropriate for p-type finFETs. For example, if the fin 56 is silicon, the epitaxial source/drain regions 84 may comprise SiGe, SiGeB, Ge, GeSn, or the like. The epitaxial source/drain regions 84 may have surfaces raised from respective surfaces of the fins 56 and may have facets. In the second region 100B, epitaxial source/drain regions 84 are formed in the fins 56 such that each dummy gate 70 is disposed between respective neighboring pairs of the epitaxial source/drain regions 84. In some embodiments epitaxial source/drain regions 84 may extend may extend past fins 56 and into the semiconductor strips 52.

The epitaxial source/drain regions 84 in the second region 100B may be implanted with dopants to form source/drain regions, similar to the process previously discussed for forming lightly doped source/drain regions, followed by an anneal. The source/drain regions may have an impurity concentration of in a range from about $10^{19}$ cm$^{-3}$ to about $10^{21}$ cm$^{-3}$. The p-type impurities for source/drain regions in the second region 50C, e.g., the PMOS region, may be any of the p-type impurities previously discussed. In other embodiments, the epitaxial source/drain regions 84 may be in situ doped during growth.

FIGS. 17A-C depicts embodiments of epitaxial source/drain regions 84 in which each source/drain region 84 is physically separate from other source/drain regions 84. In some embodiments, two or more adjacent source/drain regions 84 may be merged. An embodiment of a finFET having merged source/drain regions 84 is depicted in FIG. 18, which is taken along the C-C cross-section of FIG. 1. In FIG. 18, two adjacent source/drain regions 84 are merged. In some embodiments, more than two adjacent source/drain regions 84 may be merged.

Figure 19A:
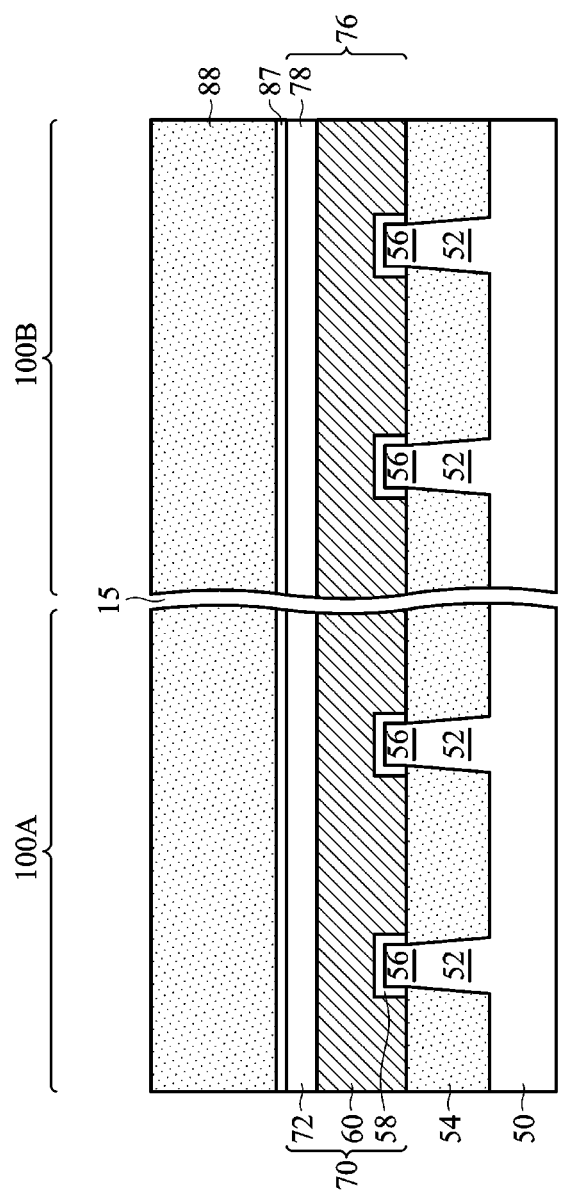
FIGS. 19A, 19B, and 19C are cross-sectional views of intermediate stages in the manufacture of a finFET device in accordance with some embodiments.
Figure 19B:
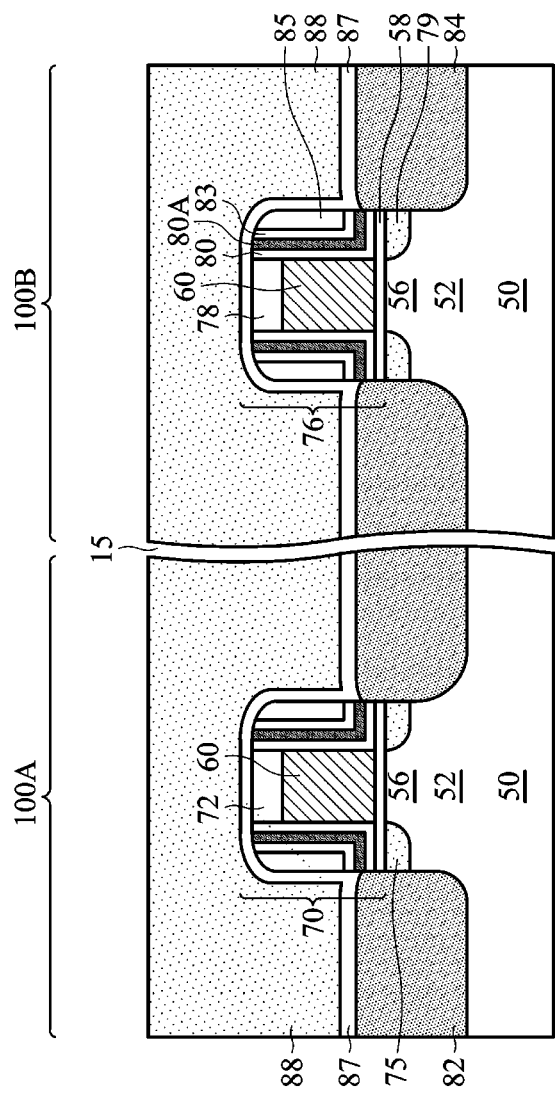
Figure 19C:
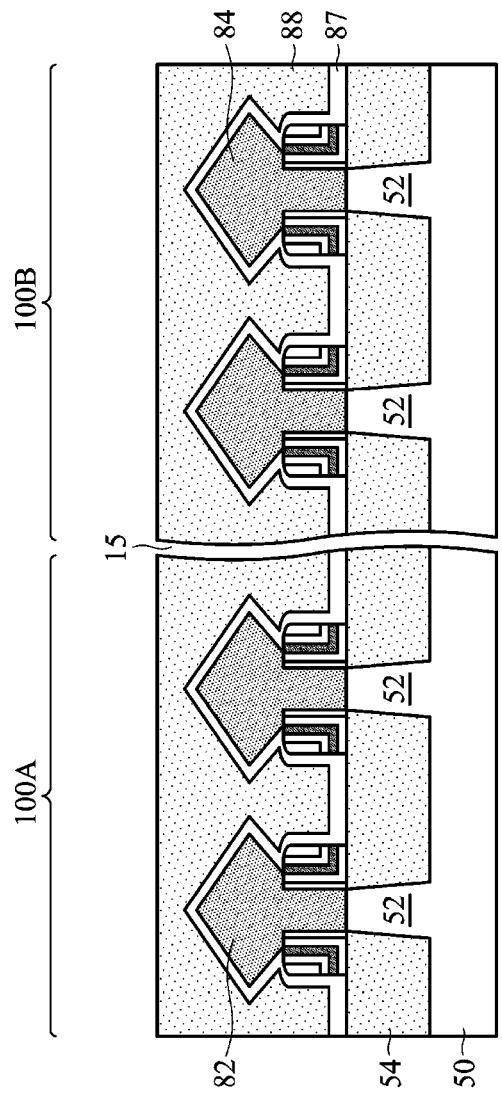

In FIGS. 19A-C, an etch stop layer 87 and an intermediate layer dielectric (ILD) 88 are deposited over the structure illustrated in FIGS. 13A-C through 18. In an embodiment, the ILD 88 is a flowable film formed by a flowable CVD. In some embodiments, the ILD 88 is formed of a dielectric material such as Phospho-Silicate Glass (PSG), Boro-Silicate Glass (BSG), Boron-Doped Phospho-Silicate Glass (BPSG), undoped Silicate Glass (USG), or the like, and may be deposited by any suitable method, such as CVD, or PECVD.

Figure 20A:
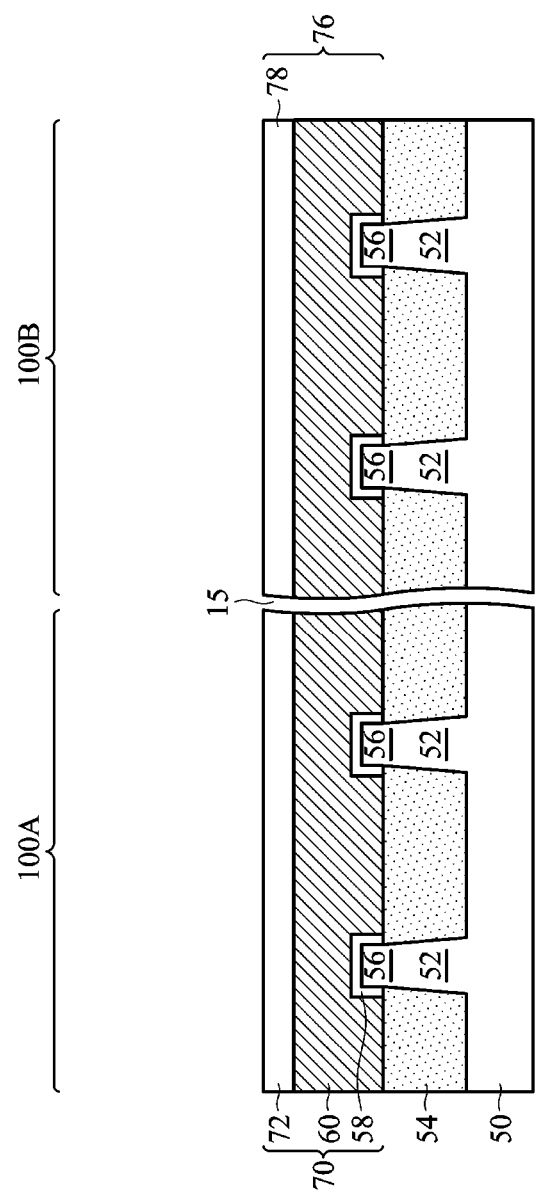
FIGS. 20A, 20B, and 20C are cross-sectional views of intermediate stages in the manufacture of a finFET device in accordance with some embodiments.
Figure 20B:
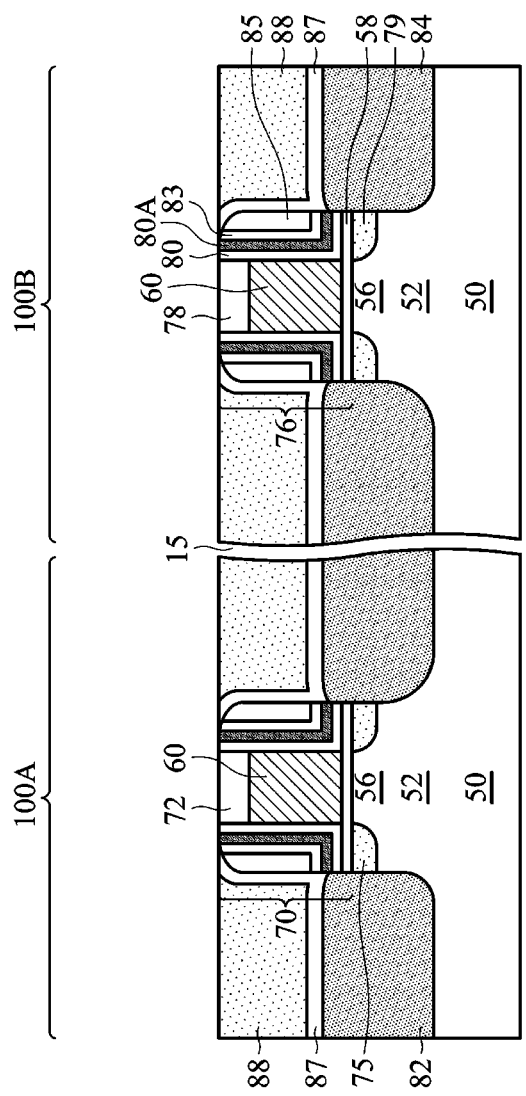
Figure 20C:
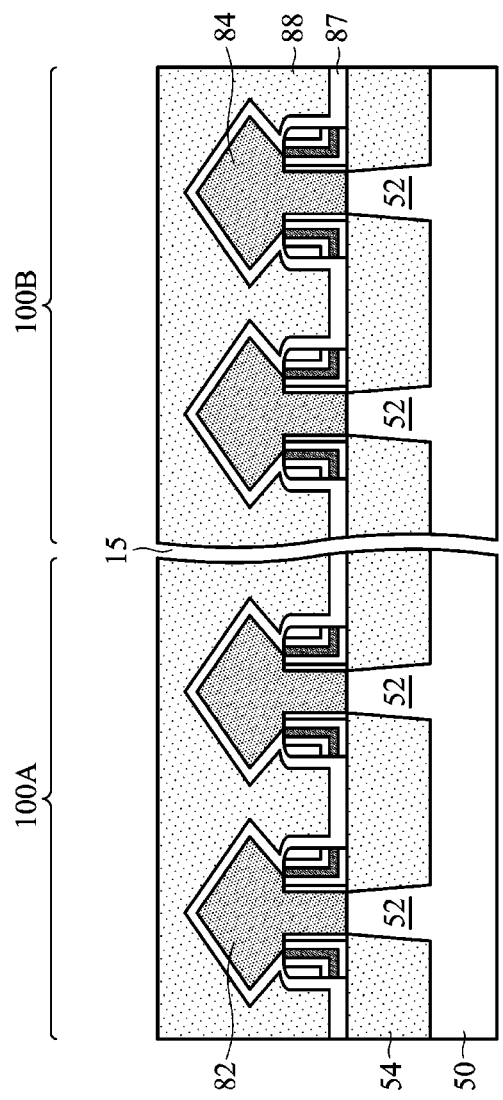

In FIGS. 20A-C, a planarization process, such as a CMP, may be performed to level the top surface of ILD 88 with the top surfaces of the dummy gates 70 and 76. After the planarization process, top surfaces of the dummy gates 70 and 76 are exposed through the ILD 88. In some embodiments, the CMP may remove the masks 72 and 78, or portions thereof. In other embodiments, masks 72 and 78 may be removed before ILD 88 is deposited.

Figure 21A:
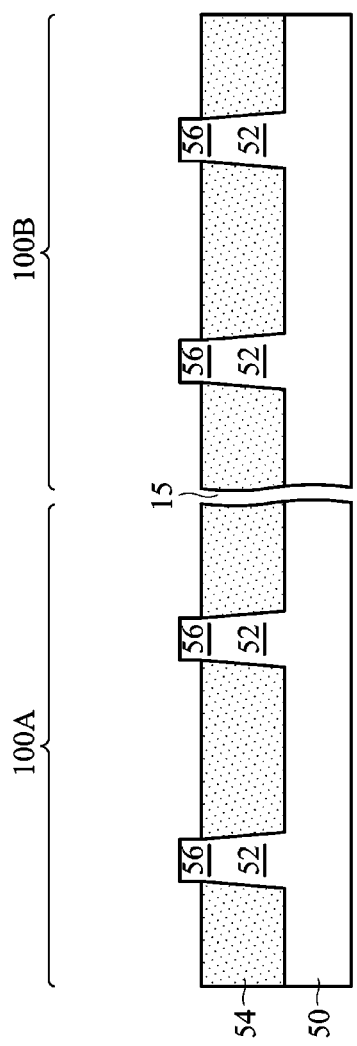
FIGS. 21A, 21B, and 21C are cross-sectional views of intermediate stages in the manufacture of a finFET device in accordance with some embodiments.
Figure 21B:
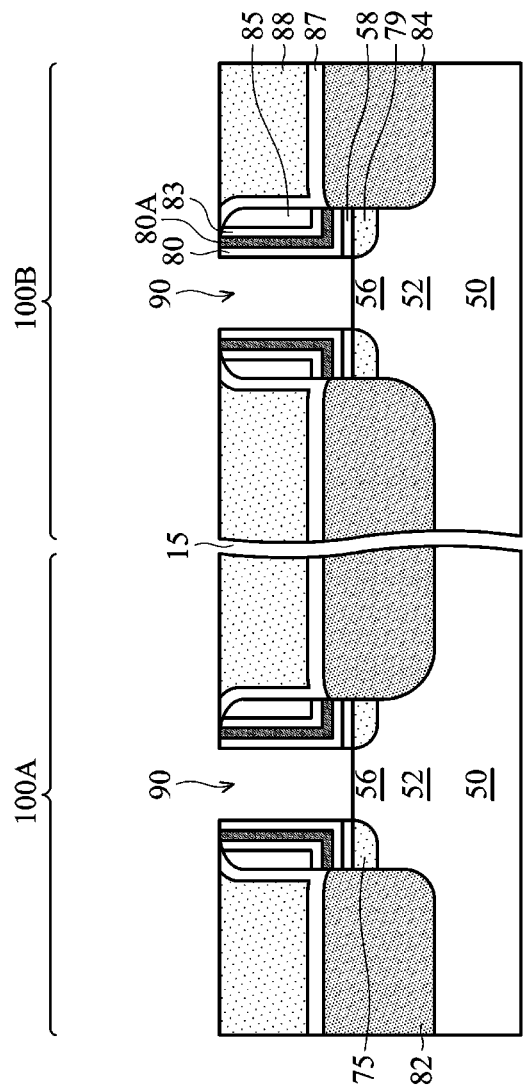
Figure 21C:
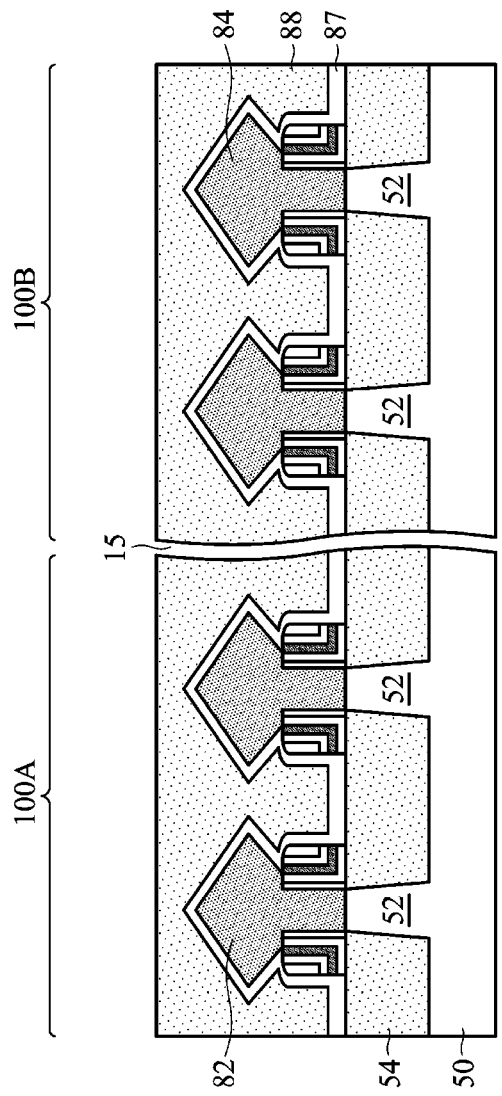

In FIGS. 21A-C, remaining portions of masks 72 and 78 and the dummy gates 70 and 76 are removed in an etching step(s), so that recesses 90 are formed. Each recess 90 exposes a channel region of a respective fin 56. Each channel region is disposed between neighboring pairs of epitaxial source/drain regions 82 and 84. During the removal, the dummy dielectric layer 58 may be used as an etch stop layer when the dummy gates 70 and 76 are etched. The dummy dielectric layer 58 may then be removed after the removal of the dummy gates 70 and 76.

As discussed earlier, the carbon treatment 101 that was performed on first gate spacer 80 may strengthen first gate spacer 80 and create a thin carbon film 80A over first gate spacer 80. The carbon treatment 101 may help to protect epitaxial source/drain regions 82 and 84 during the removal of dummy gates 70 and 76, depicted in FIGS. 21A-C. For example, in some embodiments the dummy gates 70 and 76 are removed using a wet clean that utilizes a wet cleaning chemical, such as $NH_4OH$. Without carbon treatment 101, the wet cleaning chemical may penetrate through first gate spacer 80, second gate spacer 83 and third gate spacer 85 and damage epitaxial source/drain regions 82 and 84. Carbon treatment 101 may prevent or reduce damage to epitaxial source/drain regions 82 and 84 caused by a penetration of a wet cleaning chemical through the gate spacers. Therefore, in some embodiments, the source/drain regions may be free from defects or may have reduced defects as compared to a finFET that is formed using similar processes but without carbon treatment 101 on a gate spacer. In some embodiments, carbon treatment 101 may help to increase manufacturing yields of finFET devices formed as described herein. For example, in some embodiments carbon treatment 101 may enable a 3% increase in the acceptance rate during testing of finFET devices.

Figure 22A:
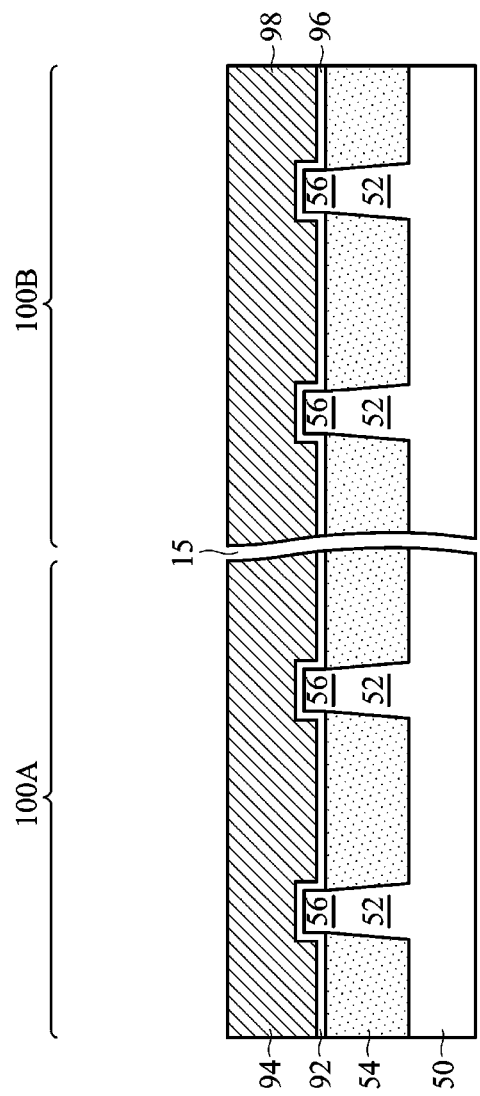
FIGS. 22A, 22B, and 22C are cross-sectional views of intermediate stages in the manufacture of a finFET device in accordance with some embodiments.
Figure 22B:
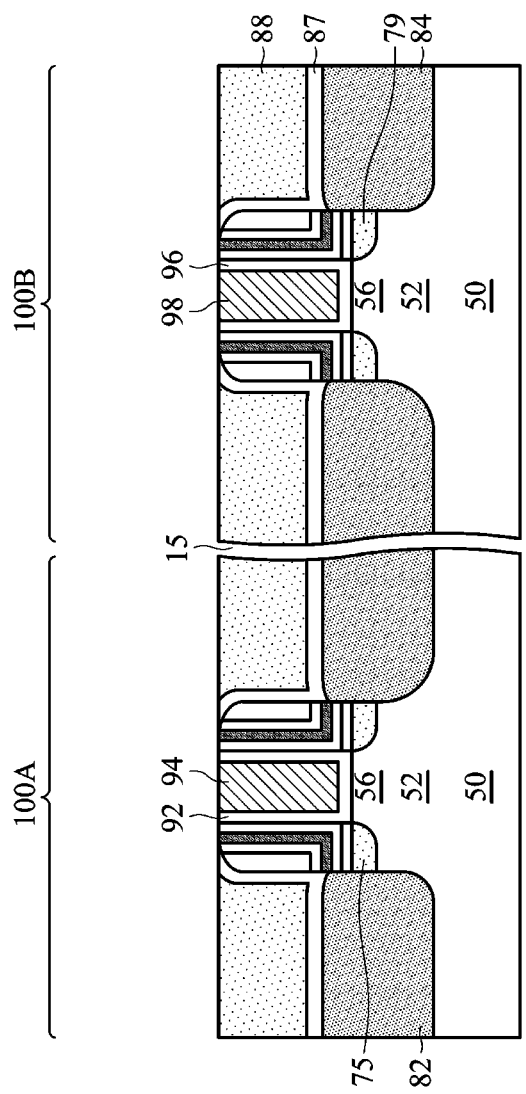
Figure 22C:
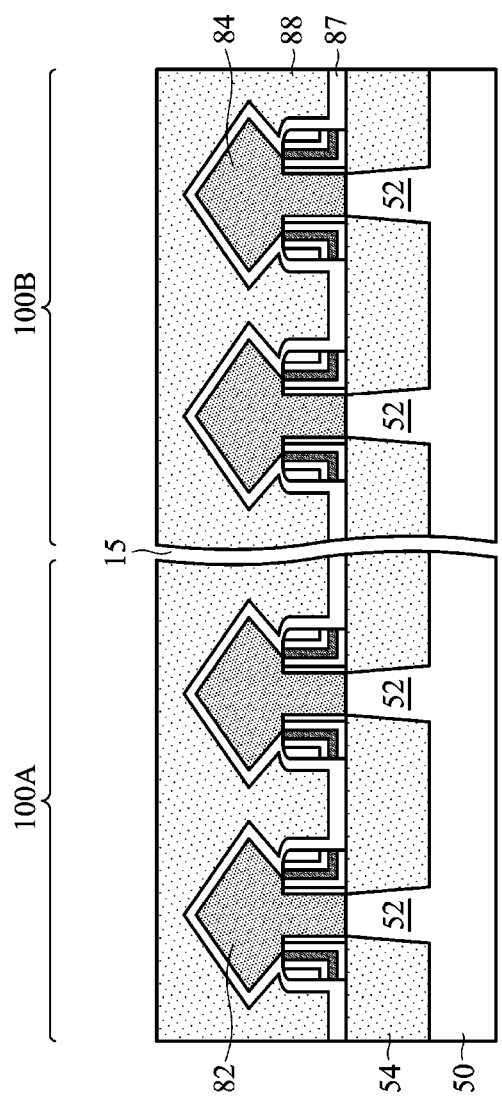

In FIGS. 22A-C, gate dielectric layers 92 and 96 and gate electrodes 94 and 98 are formed for replacement gates. Gate dielectric layers 92 and 96 are deposited conformally in recesses 90, such as on the top surfaces and the sidewalls of the fins 56 and on sidewalls of the gate spacers 86, and on a top surface of the ILD 88 (not explicitly shown in FIGS. 22A-C). In accordance with some embodiments, gate dielectric layers 92 and 96 comprise silicon oxide, silicon nitride, or multilayers thereof. In other embodiments, gate dielectric layers 92 and 96 include a high-k dielectric material, and in these embodiments, gate dielectric layers 92 and 96 may have a k value greater than about 7.0, and may include a metal oxide or a silicate of Hf, Al, Zr, La, Mg, Ba, Ti, Pb, and combinations thereof. The formation methods of gate dielectric layers 92 and 96 may include Molecular-Beam Deposition (MBD), Atomic Layer Deposition (ALD), PECVD, and the like.

Next, gate electrodes 94 and 98 are deposited over gate dielectric layers 92 and 96, respectively, and fill the remaining portions of the recesses 90. Gate electrodes 94 and 98 may be made of a metal-containing material such as TiN, TaN, TaC, Co, Ru, Al, combinations thereof, or multi-layers thereof. In some embodiments, gate electrodes 94 and 98 may each include one or more barrier layers, work function layers, and/or work function tuning layers to tune the work function of the gate electrodes 94 and 98. After the filling of gate electrodes 94 and 98, in step 228, a planarization process, such as a CMP, may be performed to remove the excess portions of gate dielectric layers 92 and 96 and the material of gate electrodes 94 and 98, which excess portions are over the top surface of ILD 88. The resulting remaining portions of material of gate electrodes 94 and 98 and gate dielectric layers 92 and 96 thus form replacement gates of the resulting finFETs.

The formation of the gate dielectric layers 92 and 96 may occur simultaneously such that the gate dielectric layers 92 and 96 are made of the same materials, and the formation of the gate electrodes 94 and 98 may occur simultaneously such that the gate electrodes 94 and 98 are made of the same materials. However, in other embodiments, the gate dielectric layers 92 and 96 may be formed by distinct processes, such that the gate dielectric layers 92 and 96 may be made of different materials, and the gate electrodes 94 and 98 may be formed by distinct processes, such that the gate electrodes 94 and 98 may be made of different materials. Various masking steps may be used to mask and expose appropriate regions when using distinct processes.

Furthermore, gate electrode 94 and gate dielectric layer 92 may be physically separated from gate stacks of adjacent finFET devices in region 100A (see e.g., FIG. 25). Similarly, gate electrode 98 and gate dielectric layer 96 may be physically separated from gate stacks of adjacent finFET devices in region 100B (see e.g., FIG. 26). In some embodiments, gate electrodes 94/98 and gate dielectric layers 92/96 may be formed to have a same pattern as dummy gate stacks 70/76 (see FIG. 7A). In such embodiments, gate electrodes 94/98 and gate dielectric layers 92/96 may be physically separated from adjacent gate stacks because dummy gate stacks 70/76 were previously patterned to be physically separated from adjacent dummy gate stacks as discussed above with respect to FIG. 7A. In other embodiments, a combination of photolithography and etching may be employed to pattern gate electrodes 94/98 and gate dielectric layers 92/96 after deposition.

Figure 23A:
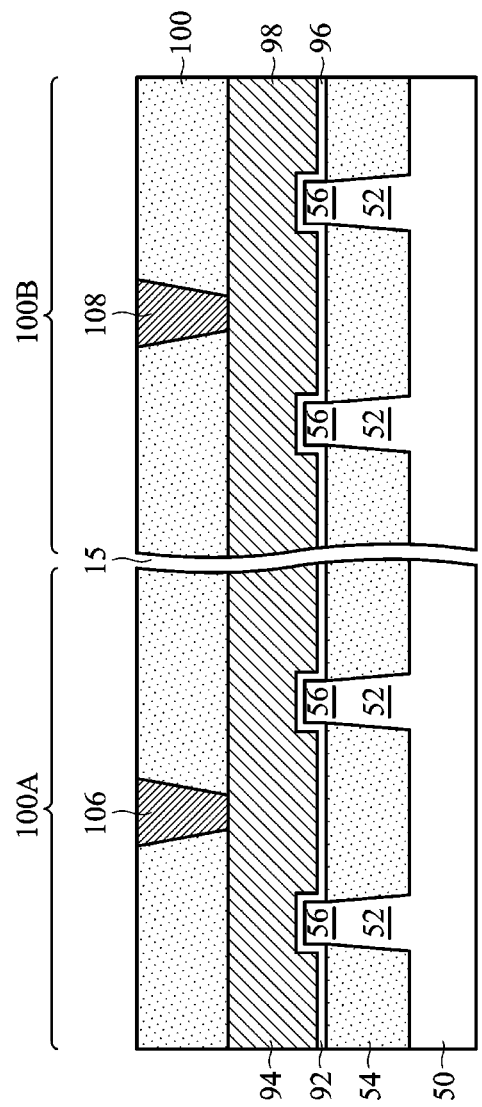
FIGS. 23A and 23B are cross-sectional views of intermediate stages in the manufacture of a finFET device in accordance with some embodiments.
Figure 23B:
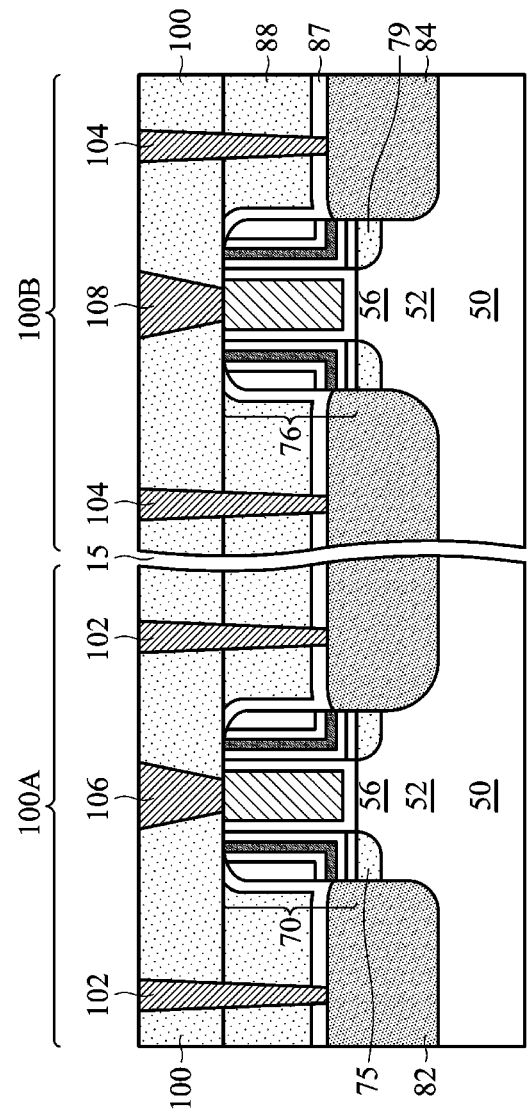

In FIGS. 23A-B, an ILD 100 is deposited over ILD 88. Further illustrated in FIGS. 23A-C, contacts 102 and 104 are formed through ILD 100 and ILD 88 and contacts 106 and 108 are formed through ILD 100. In an embodiment, the ILD 100 is a flowable film formed by a flowable CVD method. In some embodiments, the ILD 100 is formed of a dielectric material such as PSG, BSG, BPSG, USG, or the like, and may be deposited by any suitable method, such as CVD and PECVD. Openings for contacts 102 and 104 are formed through the ILDs 88 and 100. Openings for contacts 106 and 108 are formed through the ILD 100. These openings may all be formed simultaneously in a same process, or in separate processes. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, aluminum, nickel, or the like. A planarization process, such as a CMP, may be performed to remove excess material from a surface of the ILD 100. The remaining liner and conductive material form contacts 102 and 104 in the openings. An anneal process may be performed to form a silicide at the interface between the epitaxial source/drain regions 82 and 84 and the contacts 102 and 104, respectively. Contacts 102 are physically and electrically coupled to the epitaxial source/drain regions 82, contacts 104 are physically and electrically coupled to the epitaxial source/drain regions 84, contact 106 is physically and electrically coupled to the gate electrode 94, and contact 108 is physically and electrically coupled to the gate electrode 98.

While contacts 102 and 104 are depicted in FIG. 23B in a same cross-section as contacts 106 and 108, this depiction is for purposes of illustration and in some embodiments contacts 102, 104 are disposed in different cross-sections from contacts 106 and 108.

Other embodiments are possible. For example, in some embodiments, carbon treatment 101 may be performed after first gate spacer 80 is formed but before the implants for the LDD regions may be performed. In this embodiment, the resulting structure is the same or similar to the structure depicted in FIGS. 10A-C through 23A-B, where a thin carbon film 80A is formed over first gate spacer 80.

In some embodiments, carbon treatment 101 may be performed after second gate spacer 83 is formed. The resulting structure, after the same or similar processes are performed as described above in connection with FIGS. 11A-C through 23A-C is depicted in FIGS. 24A-B. In this embodiment, and consistent with the embodiment depicted in FIGS. 8A-C, first gate spacer 80 is formed over dummy dielectric layer 58 and dummy gates 10 and 76. Next, consistent with the embodiment depicted in FIGS. 9A-C, LDD regions may be formed in fin 56. Next, second gate spacer 83 may be formed over first gate spacer 80. Carbon treatment 101 may then be performed after second gate spacer 83 is formed using the same or similar methods as described above in connection with FIGS. 10A-D.

After the carbon treatment 101 second gate spacer 83 may have increased amounts of carbon. After the carbon treatment 101, carbon may be present in second gate spacer 83 in a concentration from about 5% to about 30%. The carbon plasma conformal doping of carbon treatment 101 may allow greater concentrations of carbon to be doped into the second gate spacer 83 than would be possible using other conventional methods, such as ALD. In some embodiments, after the carbon treatment 101 second gate spacer 83 may have a gradient of carbon density, with a greatest density of carbon being present at the surface of the second gate spacer 83 to which carbon plasma was incident during the carbon treatment 101 and a smallest density of carbon being present at the surface of the second gate spacer 83 that is opposite to the surface to which carbon plasma was incident during the carbon treatment 101. A thin carbon film 83A may be formed on the surface of the second gate spacer 83 to which carbon plasma was incident during the carbon treatment 101.

After performing the carbon treatment 101, third gate spacer 85 may be formed over second gate spacer 83 and carbon film 83A using processes that are the same as or similar to processes described above in connection with FIGS. 11A-C. Subsequent processing steps may be the same or similar as methods described above in connection with FIGS. 12A-C through 23A-B. The resulting structure is depicted in FIGS. 24A-C.

As described above, carbon treatment 101 may be performed on first gate spacer 80, either before or after LDD regions are formed in fin 56. Carbon treatment 101 may be performed on second gate spacer 83. In some embodiments, carbon treatment may be performed in one of these different manners, all of these different manners, or a combination of these different manners.

As discussed herein, a carbon treatment is performed on one or more gate spacers. The carbon treatment may include conformal carbon plasma doping of the one or more gate spacers. The carbon treatment may help to strengthen the one or more gate spacers and may help to protect subsequently formed epitaxially grown source/drain regions from damage during subsequent processing steps. For example, after the carbon treatment is performed, source/drain regions are epitaxially grown and dummy gates are removed, for example using a wet cleaning process. During the wet cleaning process to remove the dummy gates, the chemicals used to perform the wet cleaning may penetrate through the gate spacers and may cause damage to the epitaxially grown source/drain regions. For example, the wet cleaning process may use $NH_4OH$, and the $NH_4OH$ may penetrate through the gate spacers and cause damage to the source/drain regions. The carbon treatment may strengthen gate spacer to which it is applied and help to prevent or minimize the penetration of the wet cleaning chemical, such as $NH_4OH$, through the gate spacer, and therefore may prevent or minimize damage to the source/drain regions caused by the wet cleaning chemical. The carbon treatment may also enable a reduction or elimination of damage to source/drain regions caused by the wet cleaning chemical without the need to increase a thickness of the gate spacer, which may degrade the electrical performance of the finFET and reduce the size of the process window.

A method is provided in accordance with some embodiments. The method includes forming a first gate spacer over a dummy gate of a fin field effect transistor (finFET). The method also includes performing a first carbon plasma doping of the first gate spacer. The method also includes forming a plurality of source/drain regions, where a source/drain region is disposed on opposite sides of the dummy gate. The method also includes removing the dummy gate.

A method is provided in accordance with some embodiments. The method includes forming a dummy gate on a substrate. The method also includes forming a plurality of gate spacer layers over the dummy gate. The method also includes performing a carbon plasma doping process on one or more of the plurality of gate spacer layers. The method also includes forming a plurality of source/drain regions in the substrate. The method also includes performing a planarization process to expose a surface of the dummy gate through the plurality of gate spacer layers. The method also includes performing a wet clean process to remove the dummy gate.

A fin field effect transistor (finFET) device is provided in accordance with some embodiments. The finFET device may include a gate electrode. The finFET device may also include a gate dielectric layer extending along the gate electrode. The finFET device may also include a first gate spacer layer extending along the gate dielectric layer, wherein the first gate spacer layer is doped with carbon. The finFET device may also include a carbon film extending along the first gate spacer layer. The finFET device may also include a second gate spacer layer extending along the carbon film. The finFET device may also include a plurality of epitaxial source/drain regions, an epitaxial source/drain region of the plurality of epitaxial source/drain regions being disposed on opposite sides of the gate electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a first gate spacer over a dummy gate of a fin field effect transistor (finFET);
   performing a first carbon plasma doping of the first gate spacer, wherein the first carbon plasma doping of the first gate spacer creates a conformal carbon film over and in contact with a topmost surface and side surfaces of the first gate spacer;
   after performing the first carbon plasma doping, forming a second gate spacer over the conformal carbon film;
   performing a second carbon plasma doping of the second gate spacer;
   forming a plurality of source/drain regions, wherein the plurality of source/drain regions are disposed on opposite sides of the dummy gate; and
   removing the dummy gate.

2. The method according to claim 1, wherein after the first carbon plasma doping of the first gate spacer, a concentration of carbon in the first gate spacer is in a range of 5% to 30%.

3. The method according to claim 1, further comprising forming a plurality of lightly doped drain (LDD) regions in the finFET.

4. The method according to claim 3, wherein the first carbon plasma doping of the first gate spacer is performed before the plurality of LDD regions are formed.

5. The method according to claim 3, wherein the first carbon plasma doping of the first gate spacer is performed after the plurality of LDD regions are formed.

6. The method according to claim 1, wherein the carbon film is formed on a surface of the first gate spacer to which the carbon plasma is incident during the first carbon plasma doping.

7. The method according to claim 6, wherein the second gate spacer is formed in contact with the carbon film.

8. The method according to claim 1, wherein forming the plurality of source/drain regions comprises epitaxially growing the plurality of source/drain regions in a plurality of recesses of the finFET.

9. The method according to claim 1, wherein the first gate spacer is disposed between the second gate spacer and the dummy gate.

10. The method according to claim 3, further comprising performing a third carbon plasma doping of the second gate spacer after forming the plurality of LDD regions in the finFET.

11. The method according to claim 1, wherein removing the dummy gate comprises performing a wet cleaning process.

12. The method of claim 1, further comprising after performing the second carbon plasma doping, forming a third gate spacer over the second gate spacer.

13. The method of claim 12, wherein the first gate spacer comprises SiOCN, the second gate spacer comprises SiOCN, and the third gate spacer comprises SiN.

14. A method, comprising:
    forming a dummy gate on a substrate;
    forming a first gate spacer layer over the dummy gate;
    performing a carbon plasma doping process on the first gate spacer layer;
    after performing the carbon plasma doping process, forming a second gate spacer layer over the first gate spacer layer;
    performing a second carbon plasma doping process on the second gate spacer layer;
    forming a plurality of source/drain regions in the substrate;
    performing a planarization process to expose a surface of the dummy gate through the first gate spacer layer and the second gate spacer layer; and
    performing a wet clean process to remove the dummy gate.

15. The method according to claim 14, wherein the wet clean process is performed using $NH_4OH$ and wherein the first gate spacer layer and the second gate spacer layer that are doped with carbon substantially block the $NH_4OH$ from penetrating through the first gate spacer layer and the second gate spacer layer during the wet clean process.

16. The method according to claim 14, further comprising forming a plurality of lightly doped drain (LDD) regions in the substrate.

17. The method according to claim 16, wherein the carbon plasma doping process is performed after the plurality of LDD regions are formed.

18. The method of claim 14, wherein forming the dummy gate comprises forming a dummy dielectric layer on the substrate, and wherein a portion of the dummy dielectric layer disposed under the first gate spacer layer and the second gate spacer layer remains after performing the wet clean process.

19. A method, comprising:
  forming a first gate on a substrate, the first gate comprising a dummy dielectric layer and a dummy gate layer, the dummy dielectric layer being disposed between the dummy gate layer and the substrate in a direction perpendicular to a major surface of the substrate;
  forming a first spacer layer extending along sidewalls of the first gate, the first spacer layer having a first concentration of carbon, wherein the dummy dielectric layer is disposed between the first spacer layer and the substrate;
  placing the first spacer layer in a process chamber;
  performing a carbon plasma doping process in the process chamber on the first spacer layer, wherein after the carbon plasma doping process the first spacer layer has a second concentration of carbon, the second concentration being greater than the first concentration, and wherein the carbon plasma doping process increases the concentration of carbon in the dummy dielectric layer;
  performing a wet clean process to remove the first gate; and
  forming a second gate, the first spacer layer extending along sidewalls of the second gate.

20. The method according to claim 19, wherein the carbon plasma doping process creates a thin film of carbon along a surface of the first spacer layer.

* * * * *